(12) United States Patent
Endoh et al.

(10) Patent No.: US 10,957,371 B2
(45) Date of Patent: Mar. 23, 2021

(54) MEMORY DEVICE THAT ENABLES DIRECT BLOCK COPYING BETWEEN CELL CONFIGURATIONS IN DIFFERENT OPERATION MODES

(71) Applicant: Tohoku University, Miyagi (JP)

(72) Inventors: Tetsuo Endoh, Miyagi (JP); Yasuhiro Ohtomo, Miyagi (JP)

(73) Assignee: TOHOKU UNIVERSITY, Miyagi (JP)

( * ) Notice: Subject to any disclaimer, the term of this patent is extended or adjusted under 35 U.S.C. 154(b) by 0 days.

(21) Appl. No.: 16/485,289

(22) PCT Filed: Feb. 13, 2018

(86) PCT No.: PCT/JP2018/004869
§ 371 (c)(1),
(2) Date: Oct. 21, 2019

(87) PCT Pub. No.: WO2018/151088
PCT Pub. Date: Aug. 23, 2018

(65) Prior Publication Data
US 2020/0168264 A1 May 28, 2020

(30) Foreign Application Priority Data

Feb. 14, 2017 (JP) .............................. JP2017-025404

(51) Int. Cl.
*G11C 11/22* (2006.01)
*G11C 11/16* (2006.01)
*G11C 13/00* (2006.01)

(52) U.S. Cl.
CPC ...... *G11C 11/1673* (2013.01); *G11C 11/1655* (2013.01); *G11C 11/1657* (2013.01);
(Continued)

(58) Field of Classification Search
CPC . G11C 11/1675; G11C 11/5607; G11C 15/02; G11C 11/1655; G11C 11/1657; G11C 11/1673
See application file for complete search history.

(56) References Cited

U.S. PATENT DOCUMENTS 5,305,265 A * 4/1994 Sugibayashi .......... G11C 29/88
365/194
6,501,679 B2 * 12/2002 Hidaka ............... G11C 11/1659
365/173
(Continued)

FOREIGN PATENT DOCUMENTS

| JP | 2005-92915 A | 4/2005 |
|---|---|---|
| JP | 2014-179150 A | 9/2014 |
| WO | 2008/120333 A1 | 10/2008 |

*Primary Examiner* — Tuan T Nguyen
(74) *Attorney, Agent, or Firm* — Fox Rothschild LLP; Robert J. Sacco; Carol E. Thorstad-Forsyth

(57) ABSTRACT

A memory device includes a memory cell array in which plural memory cells are arranged in a matrix manner, and a mode selection part. The mode selection part has at least any two of a first mode, a second mode, a third mode and selects any operation mode. The first mode is for reading and writing 1-bit data with the first memory cell or the second memory cell. The second mode is for reading and writing the 1-bit data with a cell unit including the N first memory cells and the N second memory cells connected to a bit line pair. The third mode is for reading and writing the 1-bit data with a cell unit including the M first memory cells and the M second memory cells connected to the bit line pair. M and N are 1 or more integers which are different from each other.

8 Claims, 12 Drawing Sheets

(52) U.S. Cl.
CPC ...... *G11C 11/1659* (2013.01); *G11C 11/1675* (2013.01); *G11C 11/221* (2013.01); *G11C 11/2255* (2013.01); *G11C 11/2257* (2013.01); *G11C 11/2259* (2013.01); *G11C 11/2273* (2013.01); *G11C 11/2275* (2013.01); *G11C 13/003* (2013.01); *G11C 13/0004* (2013.01); *G11C 13/004* (2013.01); *G11C 13/0026* (2013.01); *G11C 13/0028* (2013.01); *G11C 13/0069* (2013.01)

(56) References Cited

U.S. PATENT DOCUMENTS

| | | | |
|---|---|---|---|
| 2003/0081453 A1* | 5/2003 | Hidaka | G11C 29/04 365/173 |
| 2004/0125647 A1* | 7/2004 | Tsuchida | G11C 11/15 365/158 |
| 2005/0057955 A1 | 3/2005 | Oikawa | |
| 2009/0207642 A1* | 8/2009 | Shimano | G11C 11/1675 365/72 |
| 2010/0157655 A1 | 6/2010 | Aoki | |
| 2014/0140124 A1* | 5/2014 | Kang | G11C 11/1673 365/148 |
| 2014/0281189 A1 | 9/2014 | Noguchi et al. | |

\* cited by examiner

MEMORY DEVICE THAT ENABLES DIRECT BLOCK COPYING BETWEEN CELL CONFIGURATIONS IN DIFFERENT OPERATION MODES

TECHNICAL FIELD

The present invention relates to a memory device.

BACKGROUND ART

Currently, most processors have hierarchical cash memories, and operation speeds and data capacities are different from each other per hierarchy level called as L1-L3 cashes. Generally, the data capacity is larger and a required operation speed is lower in a lower hierarchy level than in an upper hierarchy level. The data in the cash memories is treated per block of a predetermined data size (cash line). There are various kinds of measures for managing hierarchical cash memories. For example, data copying of the data per block, so called, block copying may be done between hierarchy levels, for example, when cash error occurs in the upper hierarchy level and cash hit occurs in the lower hierarchy level and the like.

Also, a non-volatile MRAM (Magnetoresistive Random Access Memory) is proposed to reduce power consumption. In particular, an STT (Spin Transfer Torque)-MRAM whose individual memory cell is configured by a circuit in which a magnetic tunnel junction element (hereinafter referred to as an MTJ element) and a cell transistor are serially connected to each other is paid attention.

A capacity variable type memory device using the above-mentioned STT-MRAM is known (for example, see Patent Literature 1). The memory device in Patent Literature 1 is provided with a memory cell array in which plural memory cells are arranged in a matrix with a serial circuit of the MTJ element and the cell transistor as a memory cell. In the memory cell array, a bit line and a source line are arranged per column, and each memory cell in the column is connected between the bit line and the source line. The bit line of each column is provided so as to be connected to one sense amplifier with two bit lines in the adjacent columns as one set, and the sense amplifier is provided every two columns. Also, a word line is arranged per row, and the memory cell in the corresponding row is connected to each word line.

In a memory device of Patent Literature 1, for example, a 1T-1MTJ mode, a 2T-2MTJ mode, and a 4T-4MTJ mode can be selected. The 1T-1MTJ mode is a mode for writing/reading 1-bit data to/from each memory cell, and the 2T-2MTJ mode is a mode for making two memory cells aligned in a row direction in each column of one set into one set, and writing/reading the 1-bit data to the set. Also, the 4T-4MTJ mode is a mode for four cells obtained by increasing one set of memory cells to a cell configuration in the 2T-2MTJ mode into one set, and writing/reading the 1-bit data to the set. In respective modes, an area occupying the 1-bit data gets smaller in the order of the 4T1-4MTJ mode, the 2T-2MTJ mode and the 1T-1MTJ mode, which is advantageous to realize a large capacity, however, operation speed, reliability and the like get higher in the opposite order. Therefore, for example, it is proposed to allocate the cell configuration of the 4T-4MTJ mode to a cash memory in an uppermost hierarchy level, and allocate the cell configuration of the 1T-1MTJ mode to a cash memory in a lowermost hierarchy level.

CITATION LIST

Patent Literature

Patent Literature 1: Japanese Patent Application Laid-Open No. 2014-179150

SUMMARY OF INVENTION

Technical Problem

When block copying is performed by a cash memory, complicated procedures for reading a block from a cash memory in a hierarchy level to be copied, controlling a copying destination and writing it to a hierarchy level of the copying destination in a cash memory by the memory controller are taken. In the memory device having plural operation modes as described in Patent Literature 1, such a memory device that enables direct block copying between cell configurations in the different operation modes is desired.

The present invention is made in light of the above-mentioned circumstances, and an object is to provide a memory device that enables direct block copying between cell configurations in different operation modes.

Solution to Problem

According to the present invention, a memory device having a memory cell array in which plural memory cells each including a serial circuit of an MTJ element and a cell transistor are arranged in a matrix manner, the plural memory cells including at least one or more first memory cells and one or more second memory cells, comprises plural bit line pairs each provided in a column direction and including a first bit line connected to the first memory cell and a second bit line connected to the second memory cell, plural word lines provided in a row direction, and respectively connected to the first memory cell or the second memory cell connected to the bit line pairs different from each other, a mode selection part having at least any two of a first mode for reading and writing 1-bit data with the first memory cell or the second memory cell as a reading object and a writing object, a second mode for reading and writing the 1-bit data with a cell unit including the N first memory cells and the N second memory cells connected to the bit line pair as a reading object and a writing object where N is an integer equal to or more than 1, and a third mode for reading and writing the 1-bit data with a cell unit including the M first memory cells and the M second memory cells connected to the bit line pair as a reading object and a writing object where M is an integer equal to or more than 1 different from N and selecting any operation mode, a row selection circuit for activating the word lines connected to the first memory cell and the second memory cell as the reading object and the writing object based on the operation mode, plural reading parts respectively provided corresponding to the plural bit line pairs, respectively including sense amplifiers connected to the pair of the first bit line and the second bit line, and reading the 1-bit data from the reading object, and plural writing parts respectively provided corresponding to the plural bit line pairs, respectively connected to the pair of the first bit line and the second bit line, causing a writing current to flow to one or both of the first bit line and the second bit line, and to write the 1-bit data to the writing object.

Also, a memory device having a memory cell array in which plural memory cells each having a resistance change-type memory element or a ferroelectric memory element and a cell transistor connected to each other are arranged in a matrix manner, the plural memory cells including at least one or more first memory cells and one or more second memory cells, comprises plural bit line pairs each provided in a column direction and including a first bit line connected to the first memory cell and a second bit line connected to the second memory cell, plural word lines provided in a row direction, and respectively connected to the first memory cell or the second memory cell connected to the bit line pairs different from each other, a mode selection part having at least any two of a first mode for reading and writing 1-bit data with the first memory cell or the second memory cell as a reading object and a writing object, a second mode for reading and writing the 1-bit data with the N first memory cells and the N second memory cells connected to the bit line pair as a reading object and a writing object where N is an integer equal to or more than 1, and a third mode for reading and writing the 1-bit data with the M first memory cells and the M second memory cells connected to the bit line pair as a reading object and a writing object where M is an integer equal to or more than 1 different from N and selecting any operation mode, a row selection circuit for activating the word lines connected to the first memory cell and the second memory cell as the reading object and the writing object based on the operation mode, plural reading parts respectively provided corresponding to the plural bit line pairs, respectively connected to the pair of the first bit line and the second bit line, and reading the 1-bit data from the reading object, and plural writing parts respectively provided corresponding to the plural bit line pairs, respectively connected to the pair of the first bit line and the second bit line, causing a writing current to flow or applying writing voltage to one or both of the first bit line and the second bit line, and writing the 1-bit data to the writing object.

Advantageous Effect of Invention

According to the present invention, a cell configuration of a reading object and a writing object in any operation mode between the first bit line and the second bit line is a cell configuration of one bit. Therefore, the data that can be obtained from the bit line pair has 1-bit in a reading operation in any operation mode, so that the data can be directly used for writing operations in the different operation modes, and direct block copying is possible between the different cell configurations in the operation mode.

DESCRIPTION OF EMBODIMENTS

Figure 1:
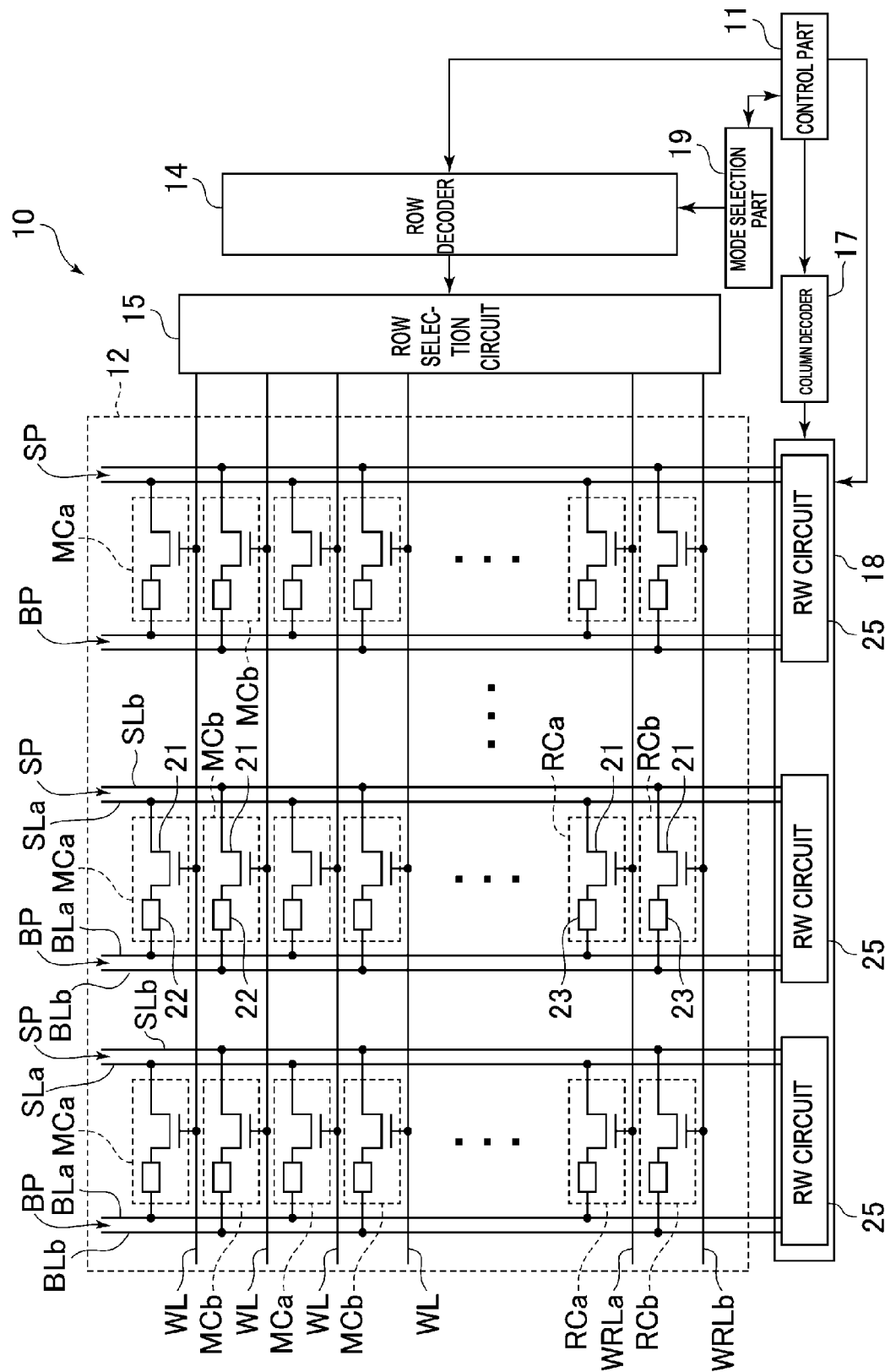
FIG. 1 is a block diagram showing a configuration of a memory device in an embodiment of the present invention.

In FIG. 1, a memory device 10 according to the present invention comprises a control part 11 for controlling each part of the memory device 10, a memory cell array 12, a row decoder 14, a row selection circuit 15, a column decoder 17, a column circuit 18, and a mode selection part 19. In the following explanation, when 1-bit input data is "1", a corresponding input data signal IN is designated as an "H-level" and an input data signal INB with the input data signal IN reversed is designated as an "L-level". When the 1-bit data is "0", the corresponding input data signal IN is designated as an "L-level" and the input data signal INB is designated as an "H-level". Also, an output data signal Out corresponding to the read data and an output data signal OutB with the signal reversed are similar to input data signals IN, INB.

Plural memory cells are arranged on the memory cell array 12 in a matrix manner. The memory cell includes a memory cell MCa as a first memory cell, a memory cell MCb as a second memory cell, a reference cell RCa as a first reference cell, and a reference cell RCb as a second reference cell.

In each column of the memory cell, the memory cells MCa and the memory cells MCb are alternately arranged in the column direction (a perpendicular direction in FIG. 1), and the reference cell RCa and the reference cell RCb are arranged at an end of the column. Thereby, plural rows in which the plural memory cells MCa are aligned, plural rows in which the plural memory cells MCb are aligned, a row in which the plural reference cells RCa are aligned, and a row in which the plural reference cells RCb are aligned, are respectively formed in a row direction (a horizontal direction in FIG. 1).

A bit line pair BP and a source line pair SP respectively extend in the column direction corresponding to each column of the memory cell. Each bit line pair BP respectively includes a first bit line BLa and a second bit line BLb, and each source line pair SP respectively includes a first source line SLa and a second source line SLb. Per column, each memory cell MCa and each reference cell RCa in the column are respectively connected between the first bit line BLa and the first source line SLa corresponding to the column. Similarly, per column, each memory cell MCb and each reference cell RCb in the column are respectively connected between the second bit line BLb and the second source line SLb corresponding to the column.

Word lines WL respectively extend in the row direction corresponding to each row of the memory cells MCa, MCb. Also, a reference word line WRLa as a first reference word line extends corresponding to the row of the reference cell RCa, and a reference word line WRLb as a second reference word line extends corresponding to the row of the reference cell RCb, respectively in the row direction. The memory cells in the corresponding rows are respectively connected to each word line WL, and the reference word lines WRLa, WRLb. Thereby, one memory cell MCa in each column is connected to one word line WL corresponding to the row of the memory cell MCa, and one memory cell MCb in each column is connected to one word line WL corresponding to the row of the memory cell MCb. Also, the reference cell RCa in each column is connected to the reference word line WRLa, and the reference cell RCb in each column is connected to the reference word line WRLb, respectively.

As described above, the memory cell MCa or the memory cell MCb is connected to the word line WL, so that the memory cell MCa or the memory cell MCb connected to the bit line pairs BP different from each other is connected to one word line WL. Also, the connection to the bit line pair BP means connection to any of the first bit line BLa and the second bit line BLb forming the bit line pair BP.

The memory cell MCa has a serial circuit in which a cell transistor 21 and an MTJ (Magnetic Tunnel Junction) element (magnetic tunnel joint element) 22 are serially connected, and the serial circuit is connected between the first bit line BLa and the first source line SLa. Concretely, for example, a drain of the cell transistor 21 is connected to the first source line SLa, a source is connected to one end of the MTJ element 22, and the other end of the MTJ element 22 is connected to the first bit line BLa. Also, a gate of the cell transistor 21 is connected to the word line WL.

Figure 2A:
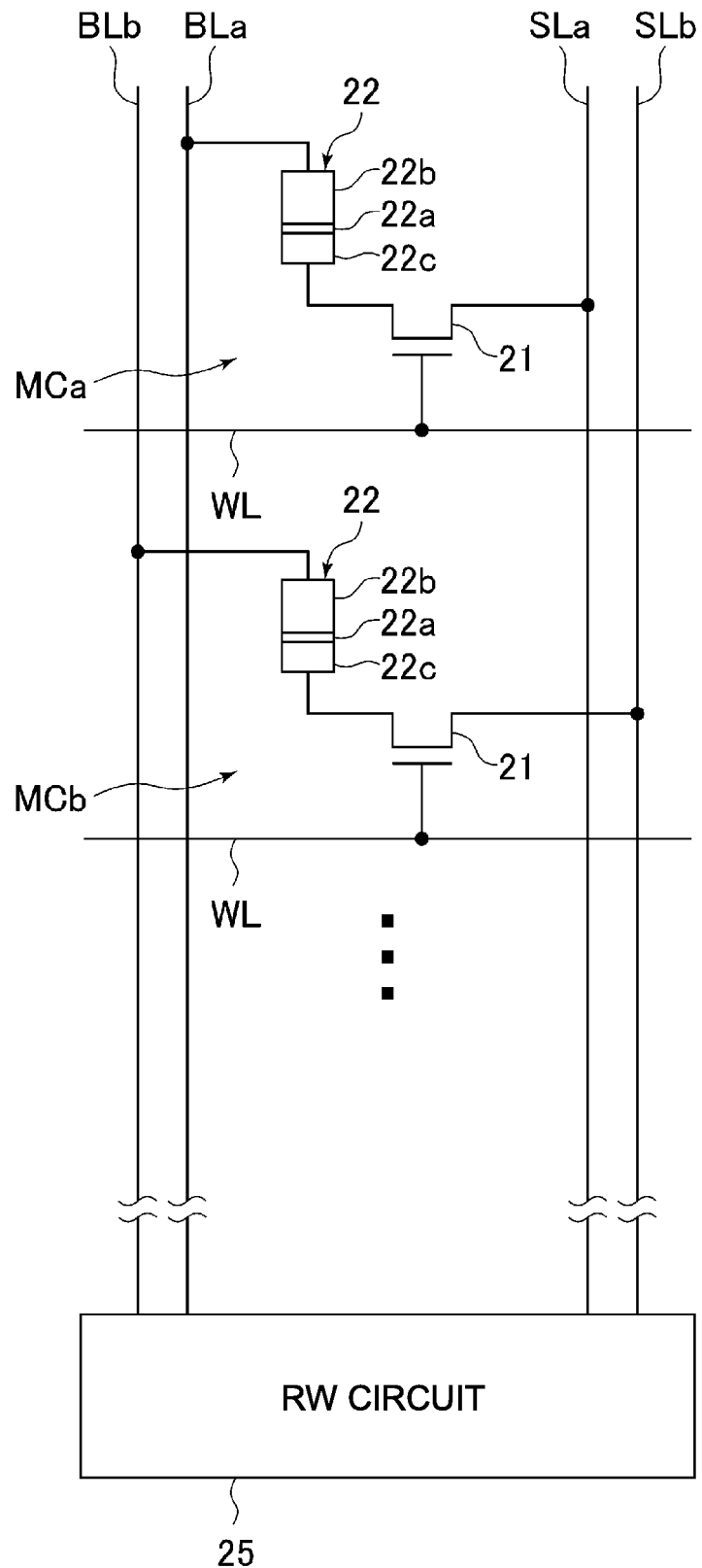
FIG. 2A is an explanatory diagram showing a configuration of an MTJ element.

As shown in FIG. 2A, the MTJ element 22 has a configuration that a magnetization fixed layer 22b and a magnetization free layer 22c are across an insulation film 22a, and the memory cell MCa can store one bit under a state of magnetization of the MTJ element 22, i.e., in a magnetization direction of the magnetization free layer 22c to a magnetization fixed layer 22b whose magnetization direction is fixed. A magnetization direction of the magnetization free layer 22c can be changed in a direction in which a current with not smaller than a predetermined threshold is caused to flow to the MTJ element 22. As well known, the MTJ element 22 becomes under a low resistance state that a resistance value is small during a parallel state that magnetization directions of the magnetization fixed layer 22b and the magnetization free layers 22c are identical to each other, and becomes under a high resistance state that the resistance value is large during an anti-parallel state that the magnetization direction of the magnetization free layer 22c is opposite to the magnetization direction of the magnetization fixed layer 22b.

A memory cell MCb has the same configuration as the memory cell MCa, and the configuration of the MTJ element 22 is also the same as shown in FIG. 2A. In the memory cell MCb, a serial circuit for the cell transistor 21 and the MTJ element 22 is connected between the second bit line BLb and the second source line SLb. In the memory cell MCb, the cell transistor 21 is connected to the second source line SLb and the MTJ element 22 is connected to the second bit line BLb. Also, a gate of the cell transistor 21 of the memory cell MCb is connected to the word line WL.

In this example, the memory cells MCa, MCb become under a low resistance state when a writing current flowing through the MTJ element 22 flows in a direction of the bit line from the source line, and under a high resistance state when the current flows in a direction of the source line from the bit line.

The reference cells RCa, RCb are used as a reference for determining magnitudes of the resistance values of the memory cells MCa, MCb in a reading operation in a below-described 1-cell mode. The reference cells RCa, RCb have a serial circuit in which the cell transistor 21 and the MTJ element 23 are serially connected to each other, as is similar to the memory cell MCa. The MTJ element 23 used for the reference cells RCa, RCb are adjusted in a manner that its resistance state shows an intermediate resistance value between the high resistance state and the low resistance state.

In the reference cell RCa, a serial circuit for the cell transistor 21 and the MTJ element 23 is connected between the first bit line BLa and the first source line SLa, and the gate of the cell transistor 21 is connected to the reference word line WRLa. Also, in the reference cell RCb, a serial circuit for the cell transistor 21 and the MTJ element 23 is connected between the second bit line BLb and the second source line SLb, and the gate of the cell transistor 21 is connected to the reference word line WRLb.

The mode selection part 19 selects an operation mode. The memory device 10 in this example has a 1-cell mode, a 2-cell mode and a 4-cell mode as operation modes. The 1-cell mode is a mode for reading and writing the 1-bit data with one memory cell MCa or one memory cell MCb as a reading object and a writing object (hereinafter, generally referred to as access objects), and corresponds to a first mode. In the 1-cell mode, each of the memory cell MCa or the memory cell MCb is configured to hold the 1-bit data.

The 2-cell mode is a mode for reading and writing the 1-bit data with one cell unit including one memory cell MCa and one memory cell MCb each as access objects. Also, the 4-cell mode is a mode for reading and writing the 1-bit data with one cell unit including two memory cells MCa and two memory cells MCb as access objects. In any of the 2-cell mode and the 4-cell mode, the memory cell MCa and the memory cell MCb are configured to hold the 1-bit data in one cell unit by holding complementary data. That is to say, in this configuration, one of a pair of the memory cell MCa and the memory cell MCb constituting the cell unit holds data of "1", and the other holds the data of "0", and the resistance states of the respective MTJ elements 22 (high resistance state, low resistance state) are opposite to each other. Also, in the 4-cell mode, the two memory cells MCa hold the same data, and the two memory cells MCb hold the same data, respectively.

In the 2-cell mode and the 4-cell mode, the cell unit is configured by the same number of the memory cells MCa and the memory cells MCb connected to the same bit line pair BP, i.e., in the same column in this example. Accordingly, in the 2-cell mode, one memory cell MCa and one memory cell MCb in the same column are made into one cell unit, and in the 4-cell mode, two memory cells MCa and two memory cells MCb in the same column are made into one cell unit. Also, in this example, the memory cells MCa, MCb continued in the column direction are combined to constitute a memory cell unit, but the constitution is not limited to this.

In the second mode of the present invention, the 1-bit data is read and written with one cell unit including the N first memory cells and the N second memory cells connected to one bit line pair as a reading object and a writing object. In the third mode, the 1-bit data is read and written with one cell unit including the M first memory cells and the M second memory cells connected to one bit line pair as a reading object and a writing object. The 2-cell mode corresponds to a second mode when N is "1", and the 4-cell mode corresponds to a third mode when M is "2". The cell unit may be constituted by the same number of the memory cells MCa and the memory cells MCb connected one bit line pair. At this time, the number of one of the memory cells MCa or the memory cells MCb has a value of "N" or "M". In this example, N is "1" and M is "2", however, the values of N, M are not limited to this, as long as the values are integers not less than 1. When N and M have the same values, the second and third modes become the same, and therefore, N and M are made to have the values different to each other, so that the second mode and the third mode are different from each other.

Also, in this example, a selectable operation is three modes, but two modes, four modes or more may be selected. For example, two modes including any operation modes of a 1-cell mode, a 2-cell mode or a 4-cell mode may be selected. For example, two modes, i.e., the 2-cell mode and the 4-cell mode may be selected. Furthermore, for example, in addition to a 6-cell mode whose cell unit is constituted by three memory cells MCa and three memory cells MCb connected to the bit line pair BP, four modes, i.e., the 1-cell mode, 2-cell mode, 4-cell mode and the 6-cell mode may be selected. The cell unit in the operation mode except for the 1-cell mode is constituted by the same number of the memory cells MCa and the memory cells MCb connected to one bit line pair as described above.

The access object in the above-mentioned operation mode is advantageous for increasing a capacity as the number of the memory cells gets smaller, and is advantageous for an operation speed, reliability and the like as the number of the memory cells gets larger. For example, the memory device 10 is used as a cash memory of three hierarchy levels. The mode selection part 19 selects the operation mode per row, so that the memory device is operated in each operation mode per plural rows of the memory cell. The plural rows of the 1-cell mode are used as L3 cashes in the lowermost hierarchy level, the plural rows of the 4-cell mode are used as L1 cashes in the upper most hierarchy level, and the remaining rows are used as L2 cashes in the 2-cell mode.

In this example, as described above, the operation mode is selected per row unit, and the operation mode can be selected per area unit in which the row units, as well as column units and the memory cell arrays are optionally divided. Also, by changing the operation mode during the operation of the memory device 10, for example, a capacity of each hierarchy level of the cash memory can be made variable. There is a need of selecting the operation mode using one memory cell MCa and one memory cell MCb in the column as a minimum unit in the 2-cell mode, and using two memory cells MCa and two memory cells MCb in the column as a minimum unit in the 4-cell mode. Accordingly, when the operation mode is selected per row, the operation mode is selected with a 2-row unit including one row of a memory cell MCa and one row of a memory cell MCb in the 2-cell mode, and a 4-row unit including two rows of the memory cells MCa and two rows of the memory cells MCb in the 4-cell mode.

The mode selection part 19 sends mode selection information to a row decoder 14 and a control part 11. The mode selection information includes information on which row is selected to which operation mode, and rows and the like made into one set in the 2-cell mode and the 4-cell mode.

The row decoder 14 outputs a row address from the control part 11, and selection signals based on selection information from the mode selection part 19 to a row selection circuit 15. The row selection circuit 15 makes any word line WL active based on the selection signals. Thereby, the word line WL connected to the memory cell MCa and the memory cell MCb as access objects is made active (H-level) by the row selection circuit 15.

The row selection circuit 15 makes one word line WL active in a writing operation in the 1-cell mode. Thereby, a cell transistor 21 of each memory cell MCa or each memory cell MCb connected to the word line WL is turned on, and the 1-bit data is written to each memory cell MCa or each memory cell MCb turned on.

Also, the row selection circuit 15 makes one word line WL, and one of a reference word line WRLa and a reference word line WRLb active in a reading operation in the 1-cell mode. The row selection circuit 15, for example, makes the reference word line WRLb active when the word line WL connected to the memory cell MCa is made active, and makes the reference word line WRLa active when the word line WL connected to the memory cell MCb is made active. Thereby, the memory cell MCa and the reference cell RCb are made into one set, and the memory cell MCb and the reference cell RCa are made into one set, so as to read the 1-bit data.

Also, by controlling writing and reading per column by a column circuit 18, the 1-bit data can be written and read to and from all of the memory cells MCa or the memory cells MCb in one row, and the 1-bit data can be written and read to and from some of the memory cells MCa or the memory cells MCb. This is similar in the 2-cell mode and the 4-cell mode in which the access object is a cell unit.

In the writing operation and the reading operation in the 2-cell mode and the 4-cell mode, the row selection circuit 15 makes each word line WL connected to the memory cell MCa and the memory cell MCb constituting a cell unit for reading or writing active. In the 2-cell mode, two word lines WL are made active, and in the 4-cell mode, four word lines WL are made active.

Figure 2B:
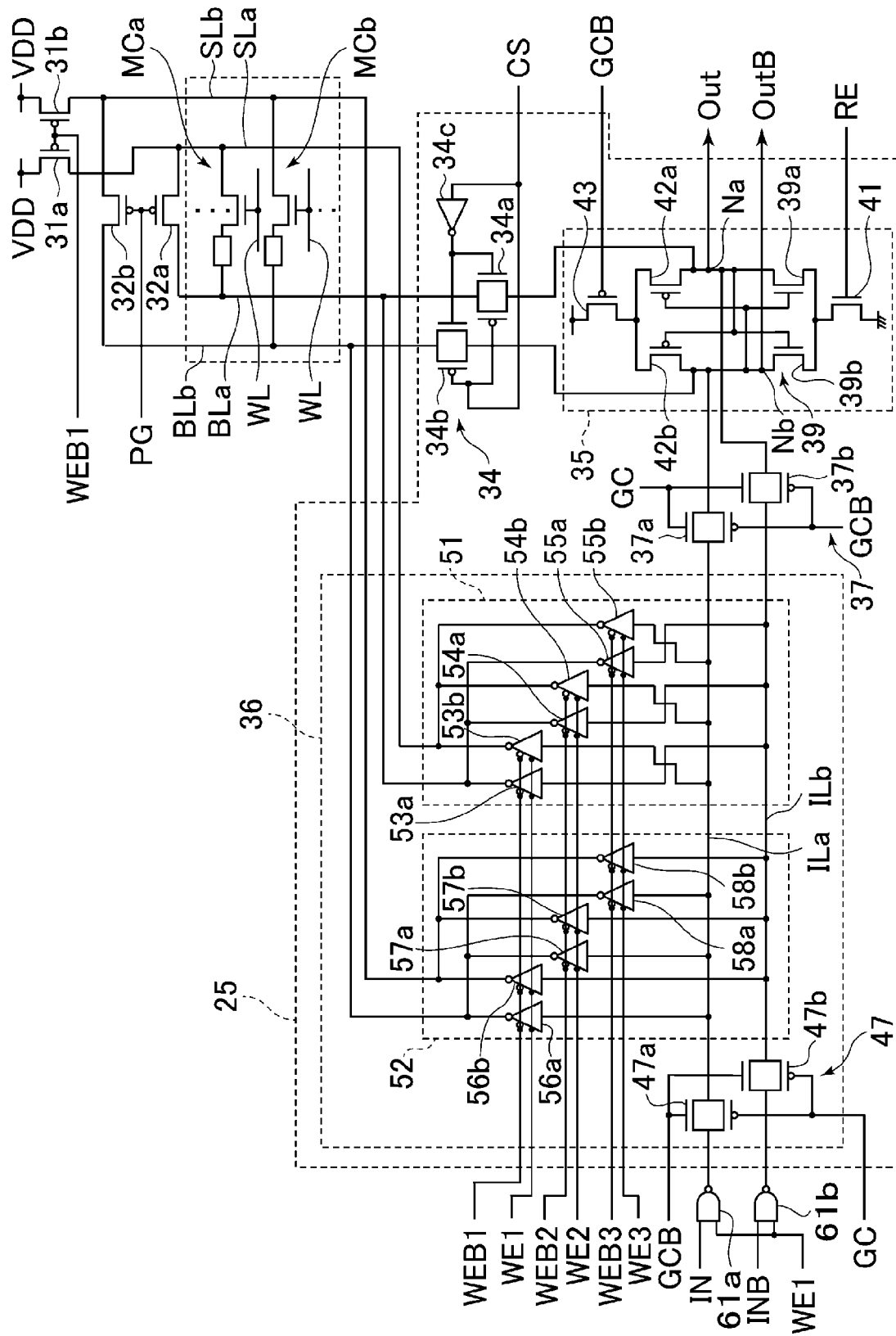
FIG. 2B is a circuit diagram showing an example of a read/write circuit for one column.

A column address is inputted to the column decoder 17 from the control part 11, so as to output column selection signals CS based on the column address (see FIG. 2B). In this example, the column selection signals CS are used for selecting the column of the reading operation. The column circuit 18 is provided with a read/write circuit 25 per column of the memory cell. Each read/write circuit 25 reads and writes the 1-bit data to and from a corresponding column.

The control part 11 outputs various signals for controlling a column circuit 18 to the column circuit 18. Various signals include first to third writing signals WE1 to WE3, WEB1 to WEB3, transfer gate signals GC, GCB, a pre-charge signal PG, a reading signal RE and the like. First to third writing signals WEB1 to WEB3, and a transfer gate signal GCB are signals obtained by reversing the first to third writing signals WE1 to WE3, and the transfer gate signal GC. In the following description, the first to third writing signals WEB1 to WEB3 and the transfer gate signal GCB may be omitted in some cases.

The control part 11 outputs only the first writing signal WE1 in the 1-cell mode, and outputs the first writing signal WE1 and the second writing signal WE2 in the 2-cell mode in the writing operation. Also, in the 4-cell mode, the first to third writing signals WE1 to WE3 are outputted.

Also, in this example, in the writing operation, the control part 11 controls the first to third writing signals WE1 to WE3 (WEB1 to WEB3) sent to each of the read/write circuit 25, so as to control which read/write circuit 25 to operate, i.e., in which column the writing operation is done, but may control the signals as is similar to the reading operation and the like by the column decoder 17 and the like.

As showing one column of the bit line pair BP, the source line pair SP and the read/write circuit 25 in FIG. 2B, a power supply voltage VDD is supplied to the first source line SLa and the second source line SLb via drive transistors 31a, 31b, respectively. The drive transistors 31a, 31b are turned on during a period except for the writing operation by the first writing signal WEB1 obtained by reversing the first writing signal WE1.

Pre-charge transistors 32a, 32b are respectively connected between the first bit line BLa and the first source line SLa, and between the second bit line BLb and the second source line SLb. The pre-charge transistors 32a, 32b are turned on by the pre-charge signal PG, so that the first bit line BLa and the second bit line BLb are respectively connected to the first source line SLa and the second source line SLb to which the power supply voltage VDD is supplied, and are pre-charged. The pre-charge signal PG is made active (L-level), when the reading operation, the writing operation and the like are not performed.

The read/write circuit 25 has a column selection circuit 34, a reading part 35, a writing part 36, and a transfer gate circuit 37. The column selection circuit 34 is constituted by transfer gates 34a, 34b and an inverter 34c.

The reading part 35 is connected to the first bit line BLa via the transfer gate 34a, and connected to the second bit line BLb via the transfer gate 34b. A column selection signal CS is inputted to a pMOS transistor constituting the transfer gates 34a, 34b, and the column selection signal CS is inputted to an nMOS transistor via the inverter 34c. The column selection signal CS is made active (L-level) by the column decoder 17, so that the first bit line BLa and the second bit line BLb are connected to the reading part 35 via the turned-on transfer gates 34a, 34b, and the 1-bit data can be read from the column of the first bit line BLa and the second bit line BLb.

The reading part 35 has transistors 39a, 39b, 41, 42a, 42b and 43. The transistors 39a, 39b, 41 are nMOS transistors, and the transistors 42a, 42b, 43 are pMOS transistors. The reading part 35 detects each current from the first bit line BLa and the second bit line BLb in the normal reading operation, and functions as a sense amplifier for outputting complementary output data signals Out, OutB. Also, the reading part 35 functions as a latch circuit for latching the read 1-bit data (output data signals Out, OutB) in a copy mode. In the copy mode, the 1-bit data is copied to the other writing object connected to the same bit line par BP as a reading object from the reading object. As described above, the reading object and the writing object are the memory cells MCa or MCb in the 1-cell mode, and are cell unis in the 2-cell mode and 4-cell mode. Normally, in the copy mode, the operation mode of the reading object and the operation mode of the writing object are different from each other.

The first bit line BLa is connected to a drain of the transistor 39a via the transfer gate 34a, and the second bit line BLb is connected to a drain of the transistor 39b via the transfer gate 34b. Also, the transistors 39a, 39b are connected to the gate and the drain. A source of each of the transistors 39a, 39b is ground via a transistor 41. The transistor 41 is turned on by making the reading signal RE active (H-level). The reading signal RE is made active during the reading operation, the writing operation and the copy mode operation.

The transistors 39a, 39b connected as described above constitute a sense amplifier 39 whose positive feedback loop is formed on a current path. The sense amplifier 39 is actuated by making the transistor 41 on, and outputs electric potentials of nodes Na, Nb based on a current difference between the first bit line BLa and the second bit line BLb as the output data signals Out, OutB. The node Na is a connection point between the drain of the transistor 39a and the first bit line BLa, and the node Nb is a connection point between the drain of the transistor 39b and the second bit line BLb.

The drains and the gates of the transistor 42a are respectively connected to those of the transistor 39a, and the drains and the gates of the transistor 42b are respectively connected to those of the transistor 39b. The power supply voltage VDD is supplied to each source of the transistors 42a, 42b via the transistor 43. The transfer gate signal GCB is inputted to the gate of the transistor 43. The transistor 43 is turned on, so that the transistors 39a, 39b, 42a, 42b function as latch circuits. That is to say, the transistor 43 is turned on, so as to form a latch circuit on which an inverter constituted by the transistors 39a, 42a and an inverter constituted by the transistors 39b, 42b are cross-coupled. The transistor 43 is turned on after the reading operation in the copy mode. Even when the reading part 35 is isolated from the first bit line BLa and the second bit line BLb by the column selection circuit 34, the reading part 35 functions as a latch circuit, so that the 1-bit reading data can be inputted to the writing part 36 from the reading part 35.

The writing part 36 is constituted by a first drive circuit 51, a second drive circuit 52, an input gate circuit 47 and the like. The input gate circuit 47 includes transfer gates 47a, 47b. The writing part 36 is connected to the transfer gate 47a at one end of a signal line ILa, and connected to the transfer gate 47b at one end of a signal line ILb, respectively. The 1-bit input data is inputted to the signal lines ILa, ILb as complementary input data signals IN, INB via the transfer gates 47a, 47b. In this example, the transfer gates 47a, 47b are turned on when a transfer gate signal GC is non-active (L-level), so as to allow the input data signals IN, INB to be inputted to the writing part 36.

In this example, the transfer gates 47a, 47b are turned on by the transfer gate signal GC, and the transfer gate signal GC is a signal for controlling the connection between the reading part 35 and the writing part 36 during the copy mode. Therefore, the transfer gates 47a, 47b are always turned on except for a period immediately after the reading operation of the copy mode until the completion of the writing operation. Also, as described below, the first drive circuit 51 and the second drive circuit 52 are connected to the reading part 35 via the first bit line BLa and the second bit line BLb. Therefore, during the reading operation, the complementary input data signals IN, INB may give influences on the reading operation of the reading part 35. To eliminate the influences, the input data signals IN, INB are inputted to the writing part 36 via NAND circuits 61a, 61b. The input data signal IN and the first writing signal WE1 are inputted to the NAND circuit 61a, and the input data signal INB and the first writing signal WE1 are inputted to the NAND circuit 61b. In this manner, even when the transfer gates 47a, 47b are turned on, each signal level of the signal lines ILa, ILb is always made to an "H-level" in the period except during the actual writing operation. The input data signals IN, INB inputted to the writing part 36 are reversed by the NAND circuits 61a, 61b.

The first drive circuit 51 causes a writing current to flow to the memory cell MCa connected to the first bit line BLa, and is constituted by drivers 53a to 55a, 53b to 55b. Inputs of the drivers 53a to 55a are connected to the signal line ILb, and outputs are connected to the first bit line BLa. Inputs of the drivers 53b to 55b are connected to the signal line ILa, and outputs are connected to the first source line SLa. The first writing signals WE1, WEB1 are inputted to the drivers 53a, 53b as control signals. Thereby, the drivers 53a, 53b are actuated when the first writing signal WE1 is active (H-level), i.e., during any writing operation of the 1-cell mode, the 2-cell mode and the 4-cell mode, and causes the writing current to flow to the memory cell MCa whose cell transistor 21 between the first bit line BLa and the first source line SLa is turned on in the direction from one driver whose output is in the "H-level" to the other driver whose output is in the "L-level".

The second writing signals WE2, WEB2 are inputted to the drivers 54a, 54b as control signals, and the third writing signals WE3, WEB3 are inputted to the drivers 55a, 55b as control signals. Therefore, the drivers 54a, 54b are actuated in the 2-cell mode and the 4-cell mode, and the drivers 55a, 55b are actuated in the 4-cell mode. The drivers 54a, 54b, 55a, 55b cause the writing current to flow during operation as is similar to the drivers 53a, 53b. In this manner, according to a cell configuration corresponding to the operation mode, i.e., the larger the number of the memory cells constituting the writing object gets, the number of the drivers is made larger, so as to increase the writing current.

The second drive circuit 52 causes a writing current to flow to the memory cell MCa connected to the second bit line BLb, and is constituted by drivers 56a to 58a, 56b to 58b similar to the drivers 53a to 55a, 53b to 55b of the first drive circuit 51. Inputs of the drivers 56a to 58a are connected to the signal line ILa, and outputs are connected to the second bit line BLb. Also, input of the drivers 56b to 58b are connected to the signal line ILb, and outputs are connected to the second source line SLb. The first writing signals WE1, WEB1 are inputted to the drivers 56a, 56b as control signals. Also, the second writing signals WE2, WEB2 are inputted to the drivers 57a, 57b as control signals, and the third writing signals WE3, WEB3 are inputted to the drivers 58a, 58b as control signals. Thereby, on the second drive circuit 52, the drivers 55a, 55b are actuated in the 1-cell mode, the 2-cell mode and the 4-cell mode, the drivers 57a, 57b are actuated in the 2-cell mode and the 4-cell mode, and the drivers 58a, 58b are actuated in the 4-cell mode. In this manner, according to the cell configuration corresponding to the operation mode, the number of the drivers is increased to make the writing current large.

The first drive circuit 51 configured as above causes the writing current to flow in the direction of the first bit line BLa via the memory cell MCa from the first source line SLa and changes the MTJ element 22 to a low resistance state, when the input data is "1". Also, the first drive circuit 51 causes the writing current to flow in the direction of the first source line SLa via the memory cell MCa from the first bit line BLa and changes the MTJ element 22 to a high resistance state, when the input data is "0".

The second drive circuit 52 causes the writing current to flow in the direction of the second source line SLb via the memory cell MCa from the second bit line BLb and changes the MTJ element 22 to a high resistance state, when the input data is "1". Also, the second drive circuit 52 causes the writing current to flow in the direction of the second bit line BLb via the memory cell MCb from the second source line SLb and changes the MTJ element 22 to a low resistance state, when the input data is "0".

Also, when the first writing signal WE1 is non-active, the drivers 53a to 58a, 53b to 58b have outputs in a high impedance state, so the respective outputs are isolated electrically from the first bit line BLa, the second bit line BLb, the first source line SLa, and the second source line SLb. When the first writing signal WE1 is non-active, the second writing signal WE2 and the third writing signal WE3 also become non-active.

In the read/write circuit 25, the nodes Na, Nb serving as output ends of the reading part 35 and the signal lines ILa, ILb serving as input ends of the writing part 36 are connected to each other via the transfer gate circuit 37. That is to say, an input end of the writing part 36 is connected to an output end of the latch circuit of the reading part 35 connected to the same bit line pair BP.

The transfer gate circuit 37 includes transfer gates 37a, 37b. The signal line ILa is connected to the node Nb via the transfer gate 37a, and the signal line ILb is connected to the node Na via the transfer gate 37b. By this connection, the output data signals Out, OutB inputted to the writing part 36 via the transfer gate circuit 37 from the reading part 35 are made equivalent to the input data signals IN, INB.

The transfer gates 37a, 37b are turned on by making the transfer gate signal GC active during a period immediately after the reading operation of the copy mode until the completion of the writing operation. The transfer gates 37a, 37b are turned on, so that the 1-bit data read by the reading part 35 is inputted directly to the writing part 36.

Then, actions in the above-mentioned configuration will be explained. The operations to each column of the memory cell are basically the same, so an operation to one column will be explained as an example. To simplify the explanation, as shown in FIG. 3, L1 to L3 cash memories are allocated to each row of one column of the memory cell, and the operation mode is selected corresponding to the L1 to L3 cash memories by the mode selection part 19.

Figure 3:
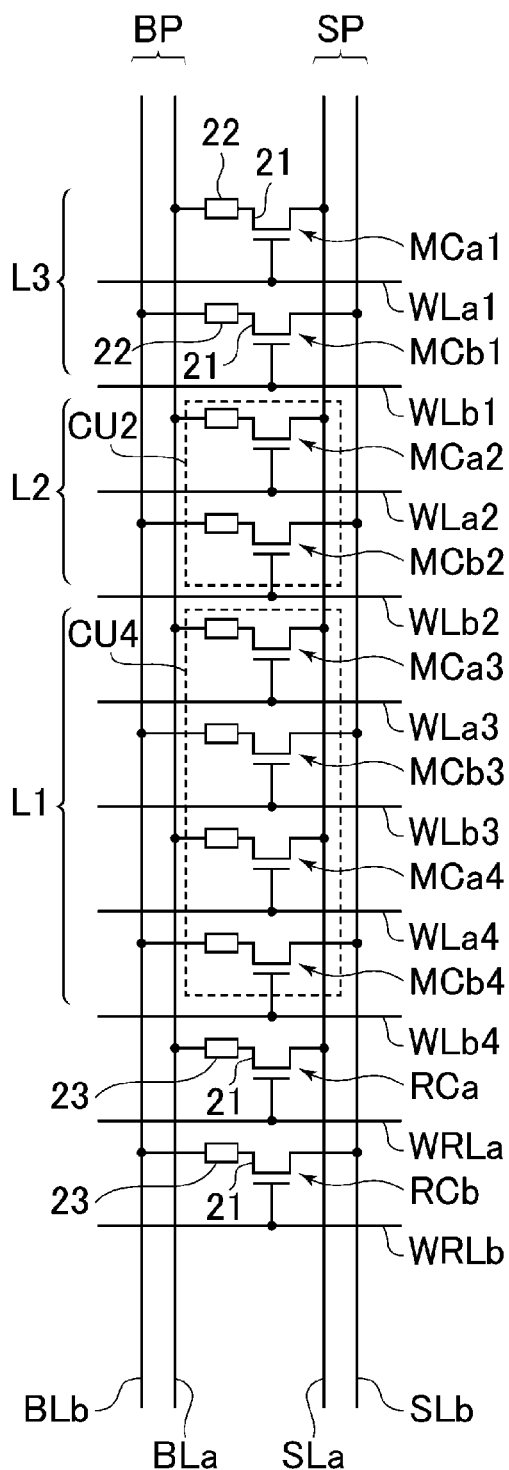
FIG. 3 is an explanatory diagram showing one example of a state that each operation mode is selected.

In the example of FIG. 3, the memory cell MCa1 and the memory cell MCb1 are accessed in the 1-cell mode, and the memory cell MCa2 and the memory cell MCb2 constitute one cell unit CU2 in the 2-cell mode and are accessed in the 2-cell mode. The memory cells MCa3, MCa4 and the memory cells MCb3, MCb4 constitute one cell unit CU4 in the 4-cell mode and are accessed in the 4-cell mode. The memory cell MCa1 and the memory cell MCb1 are allocated to the L3 cash, the cell unit CU2 is allocated to the L2 cash, and the cell unit CU4 is allocated to the L1 cash, respectively. Also, word lines connected to the memory cells MCa1 to MCa4 are designated as word lines WLa1 to WLa4, and word lines connected to the memory cells MCb1 to MCb4 are designated as word lines WLb1 to WLb4.

Figure 4:
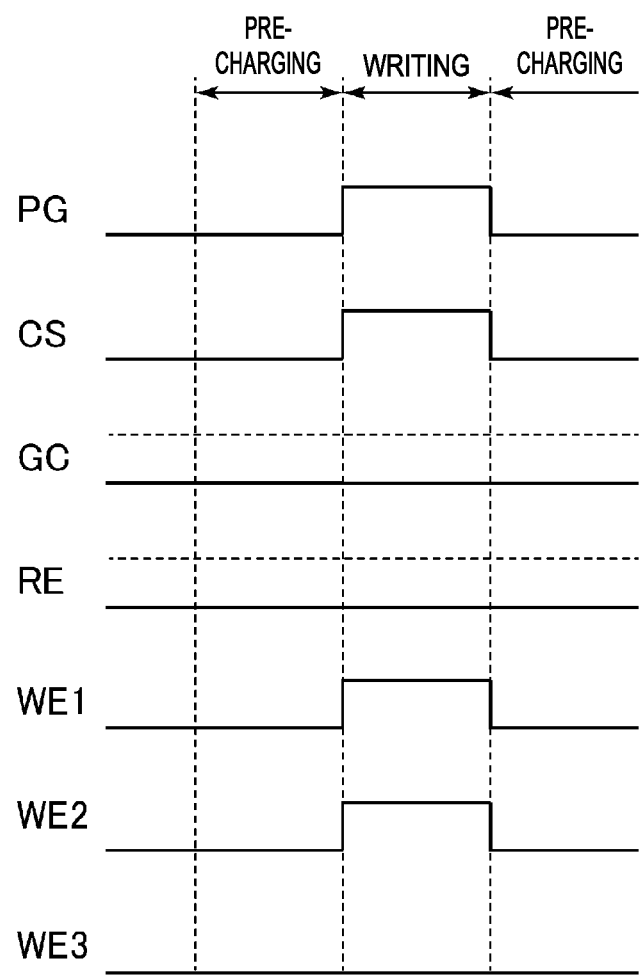
FIG. 4 is a timing chart showing a signal change of major signals of a writing operation.

First, the writing operation and the reading operation in the 2-cell mode will be explained. This is not limited to the 2-cell mode, but as shown in FIG. 4, a pre-charge state is provided before a normal writing operation. Under this pre-charge state, the pre-charge signal PG is active, the column selection signal CS is active, the transfer gate signal GC is non-active, the reading signal RE is non-active, and the first to third writing signals WE1 to WE3 are non-active.

Therefore, the power supply voltage VDD is supplied to the first source line SLa and the second source line SLb via the turned on drive transistors 31a, 31b. Also, the first bit line BLa and the first source line SLa are connected to each other and the second bit line BLb and the second source line SLb are connected to each other by the turned on pre-charge transistors 32a, 32b, so that the first bit line BLa and the second bit line BLb are pre-charged. At that time, because the transfer gates 34a, 34b of the column selection circuit 34 are turned on, the first bit line BLa, the second bit line BLb and the reading part 35 are connected to each other. However, because the transistor 41 is turned off, the reading part 35 including the sense amplifier 39 is not operated.

Also, because the respective transfer gates 37a, 37b of the transfer gate circuit 37 are turned off, the reading part 35 and the writing part 36 is disconnected via the transfer gate circuit 37. In the normal writing operation, the transfer gate signal GC is maintained non-active, so that the disconnection of the reading part 35 and the writing part 36 is maintained.

When an address for making the cell unit CU2 as a writing object is inputted, the control part 11 specifies that the operation mode is the 2-cell mode based on the address and selection information from the mode selection part 19, and makes the first writing signal WE1 and the second writing signal WE2 to the read/write circuit 25 of the cell unit CU2 active. At that time, the pre-charge signal PG and the column selection signal CS are respectively made non-active. When the first writing signal WE1 and the second writing signal WE2 to the read/write circuits 25 in the respective rows are controlled, a column to be written can be selected.

At the same time, when a row address for making the cell unit CU2 as a writing object is inputted to the row decoder 14, the word lines WLa2, WLb2 respectively connected to the memory cells MCa2, MCb2 constituting the cell unit CU2 are made active by the row selection circuit 15 based on the row address and the selection information.

The first writing signal WE1 is made active, so that the drive transistors 31a, 31b are turned off and the first source line SLa and the second source line SLb are isolated from a power source. Also, the pre-charge signal PG is made non-active, so that the pre-charge transistors 32a, 32b are tuned off and the first bit line BLa and the second bit line BLb are respectively isolated from the first source line SLa and the second source line SLb. Furthermore, the column selection signal CS is made non-active, the respective transfer gates 34a, 34b of the column selection circuit 34 are turned off, and the first bit line BLa, the second bit line BLb and the reading part 35 are isolated from each other.

Because the transfer gate signal GC is non-active, respective transfer gates 47a, 47b of an input gate circuit 47 are turned on. Then, the first writing signal WE1 inputted to NAND circuits 61a, 61b is made active, so that signals obtained by reversing the input data signals IN, INB corresponding to the input data are outputted from the NAND circuits 61a, 61b, respectively. Signals obtained by reversing the input data signals IN, INB are inputted to the first drive circuit 51 and the second drive circuit 52 via the transfer gates 47a, 47b and the signal lines ILa and ILb, respectively.

As described above, the first writing signal WE1 and the second writing signal WE2 are made active, so that the drivers 53a, 53b, 54a, 54b of the first drive circuit 51 and the drivers 56a, 56b, 57a, 57b of the second drive circuit 52 are actuated respectively. A writing current with a direction corresponding to signal levels of the signal lines ILa, ILb is caused to flow by the actuated drivers 53a, 53b, 54a, 54b on the first drive circuit 51, and by the actuated drivers 56a, 56b, 57a, 57b on the second drive circuit 52. At that time, the word lines WLa2, WLb2 are active, so that the cell transistors 21 of the memory cells MCa2, MCb2 are turned on, respectively.

Therefore, the writing current from the first drive circuit 51 flows to the MTJ element 22 of the memory cell MCa2, and writing current from the second drive circuit 52 flows to the MTJ element 22 of the memory cell MCb2. Thereby, a magnetization of each MTJ element 22 of the memory cells MCa2, MCb2 changes. For example, when the input data is "1", the writing current flows in a direction from the first source line SLa toward the first bit line BLa via the memory cell MCa2, and the writing current flows in a direction from the second bit line BLb toward the second source line SLb via the memory cell MCb2. Thereby, the MTJ element 22 of the memory cell MCa2 is under a low resistance state, and the MTJ element 22 of the memory cell MCb2 is under a high resistance state. As a result, the data "1" is held in the cell unit CU2.

When the input data is "0", the writing current flows in a direction opposite to the direction when the input data is "1", so that the MTJ element 22 of the memory cell MCa2 is under a high resistance state, and the MTJ element 22 of the memory cell MCb2 is under a low resistance state. As a result, the data "0" is held in the cell unit CU2.

In any case, the memory cell MCa2 and the memory cell MCb2 have states of magnetization opposite to each other. Therefore, when the memory cells MCa2, MCb2 are cells for holding the data, complementary data is written.

As described above, when writing to the cell unit CU2 is completed, the pre-charge state is provided, so that the pre-charge signal PG and the column selection signal CS are made active and the first writing signal WE1 and the second writing signal WE2 are made non-active. Furthermore, the word lines WLa2, WLb2 are made non-active. The states of magnetization of the memory cells MCa2 and MCb2 does not change and the 1-bit data is non-volatile stored in the cell unit CU2, even when the writing current does not flow, the power source supply to the memory device 10 is shut down, or the like.

Figure 5:
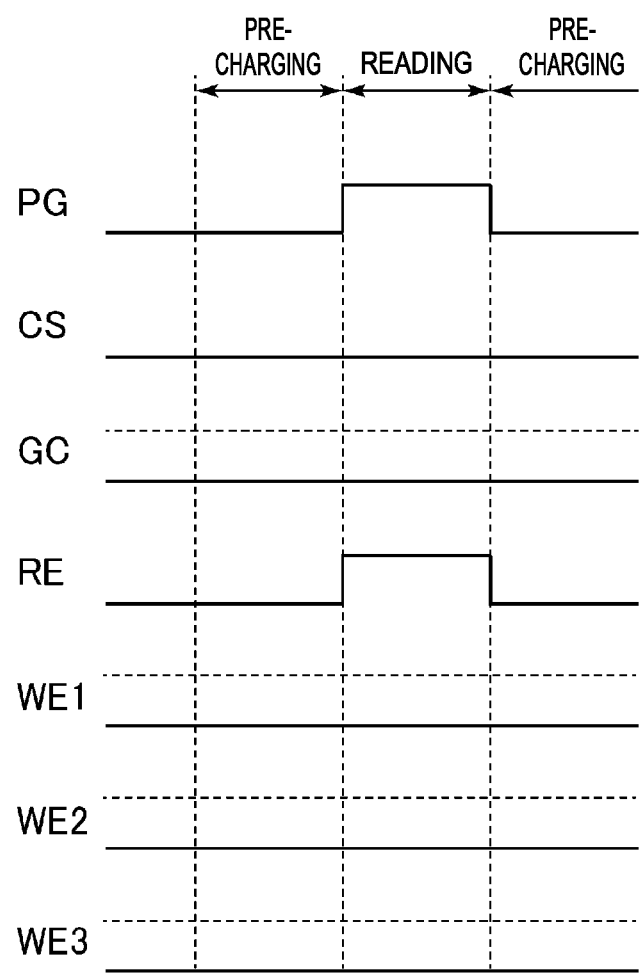
FIG. 5 is a timing chart showing a signal change of major signals of a reading operation.

When the 1-bit data is read from the cell unit CU2, as shown in FIG. 5, from the pre-charge state, the pre-charge signal PG is made non-active and the reading signal RE is made active, so as to start the reading operation. Thereby, the pre-charge transistors 32a, 32b are turned off, and the first bit line BLa and the second bit line BLb are electrically isolated from the first source line SLa and the second source line SLb. Also, the reading signal RE is made active, so that the transistor 41 is turned on and the sense amplifier 39 of the reading part 35 is actuated. At that time, the column selection signal CS is maintained more active than in the pre-charge state, so that the first bit line BLa and the second bit line BLb are in contact with the sense amplifier 39. Here, when the column selection signal CS to the read/write circuit 25 in each column is controlled, a column to be read can be selected.

Also, as is similar to the writing operation, the word lines WLa2, WLb2 connected to the memory cells MCa2, MCb2 constituting the cell unit CU2 serving as a reading object are made active by the row selection circuit 15, based on the row address of the cell unit CU2 and the selection information. Thereby, the respective cell transistors 21 of the memory cell MCa2 and the memory cell MCb2 are turned on.

The power supply voltage VDD is supplied to the first source line SLa and the second source line SLb, so that a current flows to the first bit line BLa via the memory cell MCa2 from the first source line SLa, and a current flows to the second bit line BLb via the memory cell MCb2 from the second source line SLb. Then, the respective currents flowing to the first bit line BLa and the second bit line BLb flow to the sense amplifier 39 via the column selection circuit 34. At that time, the current corresponding to a resistance state (resistance value) of the MTJ element 22 of the memory cell MCa2 flows to the first bit line BLa, and a current corresponding to the resistance state of the MTJ element 22 of the memory cell MCb2 flows to the second bit line BLb. Any one of the respective MTJ elements 22 of the memory cells MCa2, MCb2 is under a high resistance state, and the other is under a low resistance state, so that there is a difference between the respective currents flowing to the first bit line BLa and the second bit line BLb. According to the current difference, one of the nodes Na, Nb of the sense amplifier 39 is in an "H-level" and the other is in an "L-level".

For example, when the MTJ element 22 of the memory cell MCa2 is under a low resistance state and the MTJ element 22 of the memory cell MCb is under a high resistance state, the current flowing to the first bit line BLa is larger than that to the second bit line BLb, so that the node Na is in the "H-level" and the node Nb is in the "L-level". As a result, the reading data "1" (the output data signal Out is in the "H-level" and the output data OutB is in the "L-level") can be obtained. When the MTJ element 22 of the memory cell MCa2 is under a high resistance state and the MTJ element 22 of the memory cell MCb is under a low resistance state, the current flowing to the second bit line BLb is larger than that to the first bit line BLa, so that the node Na is in the "L-level" and the node Nb is in the "H-level". As a result, the reading data "0" (the output data signal Out is in the "L-level" and the output data signal OutB is in the "H-level") can be obtained.

The 1-bit data is written and read in the 1-cell mode and the 4-cell mode, as is similar to the 2-cell mode, except that the word line and the writing signal made active are different.

For example, when the 1-bit data is written to the memory cell MCa or the memory cell MCb in the 1-cell mode, the word line WLa1 connected to the memory cell MCa1 serving as a writing object or the word line WLb1 connected to the memory cell MCb2 are made active. Also, only the first writing signal WE1 is made active. Thereby, the drivers 53a, 53b of the first drive circuit 51 are actuated, and the drivers 56a, 56b of the second drive circuit 52 are actuated, so that the 1-bit data is written to the memory cell MCa or the memory cell MCb.

In this manner, when the data is read from the memory cell MCa or the memory cell MCb to which the 1-bit data is written in the 1-cell mode, any one of the word line WLa1 connected to the memory cell MCa1 serving as a reading object or the word line WLb1 connected to the memory cell MCb1 is made active, and any one of the reference word line WRLa or the reference word line WRLb is made active according to the reading object.

For example, when the memory cell MCa1 is a reading object, the reference word line WRLb corresponding to the reference cell RCb connected to the second bit line BLb different from the first bit line BLa connected to the memory cell MCa1 is made active together with the word line WLa1. In this case, the current corresponding to the resistance state of the MTJ element 22 of the memory cell MCa1 flows to the first bit line BLa, and the current corresponding to an intermediate state of the high resistance state and the low resistance state of the MTJ element 23 of the reference cell RCb flows to the second bit line BLb. As a result, when the MTJ element 22 of the memory cell MCa1 is under the low resistance state, the electric potential of the node Na of the sense amplifier 39 is in the "H-level" and the electric potential of the node Nb is in the "L-level", so as to obtain "1" as reading data. When it is under the high resistance state, the electric potential of the node Na of the sense amplifier 39 is in the "L-level" and the electric potential of the node Nb is in the "H-level", so as to obtain "0" as reading data.

Also, when the 1-bit data is written to a cell unit CU4 in the 4-cell mode, four word lines WLa3, WLa4, WLb3, WLb4 connected to the memory cells MCa3, MCa4, MCb3, MCb4 constituting the cell unit CU4 serving as a writing object are respectively made active. Also, the first to third writing signals WE1 to WE3 are respectively made active. Thereby, the drivers 53a to 55a, 53b to 55b of the first drive circuit 51 are actuated, and the drivers 56a to 58a, 56b to 58b of the second drive circuit 52 are actuated to change the states of magnetization of the memory cells MCa3, MCa4, MCb3, MCb4, and write the 1-bit data to the cell unit CU4. At that time, the resistance states of the memory cells MCa3, MCa4 are the same as that of the memory cell MCa2 in the 2-cell mode, and the resistance states of the memory cells MCb3, MCb4 are the same as that of the memory cell MCb2 in the 2-cell mode.

As described above, the data is read from the cell unit CU4 to which the 1-bit data is written in the 4-cell mode, four word lines WLa3, WLa4, WLb3, WLb4 corresponding to the memory cells MCa3, MCa4, MCb3, MCb4 constituting the cell unit CU4 serving as a reading object are respectively made active, so as to perform a reading operation. In the cell unit CU4, the current corresponding to a synthetic resistance of each MTJ element 22 of the memory cells MCa3, MCa4 flows to the first bit line BLa, and the current corresponding to a synthetic resistance of each MTJ element 22 of the memory cells MCb3, MCb4 flows to the second bit line BLb. Then, one of the nodes Na, Nb of the sense amplifier 39 is in the "H-level" and the other is in the "L-level" according to the current difference.

For example, when each MTJ element 22 of the memory cells MCa3, MCa4 is under the low resistance state and each MTJ element 22 of the memory cells MCb3, MCb4 is under the high resistance state, the node Na is in the "H-level" and the node Nb is in the "L-level", so as to obtain the reading data "1". When each MTJ element 22 of the memory cells MCa3, MCa4 is under the high resistance state and each MTJ element 22 of the memory cells MCb3, MCb4 is under the low resistance state, the node Na is in the "L-level" and the node Nb is in the "H-level", so as to obtain the reading data "0". Also, the current flowing to the first bit line BLa and the second bit line BLb in the reading operation in the 4-cell mode is larger than that in the 2-cell mode. Therefore, the electric potentials of the nodes Na, Nb change more rapidly than in the 2-cell mode, so that a reading period can be made shorter than in the 2-cell mode.

As described above, the 1-bit data same as input data inputted during the writing operation is also read from an access object (memory cell MCa1, MCb1, cell units CU2, CU4) in any operation mode.

Then, an example of the operation in the copy mode in the above-mentioned constitution when a copy origin is the memory cell MCb1 that is an access object in the 1-cell mode and a copy destination is the cell unit CU2 that is an access object in the 2-cell mode will be explained. When block copy is performed, the same operations may be simultaneously performed for each column corresponding to the block.

Figure 6:
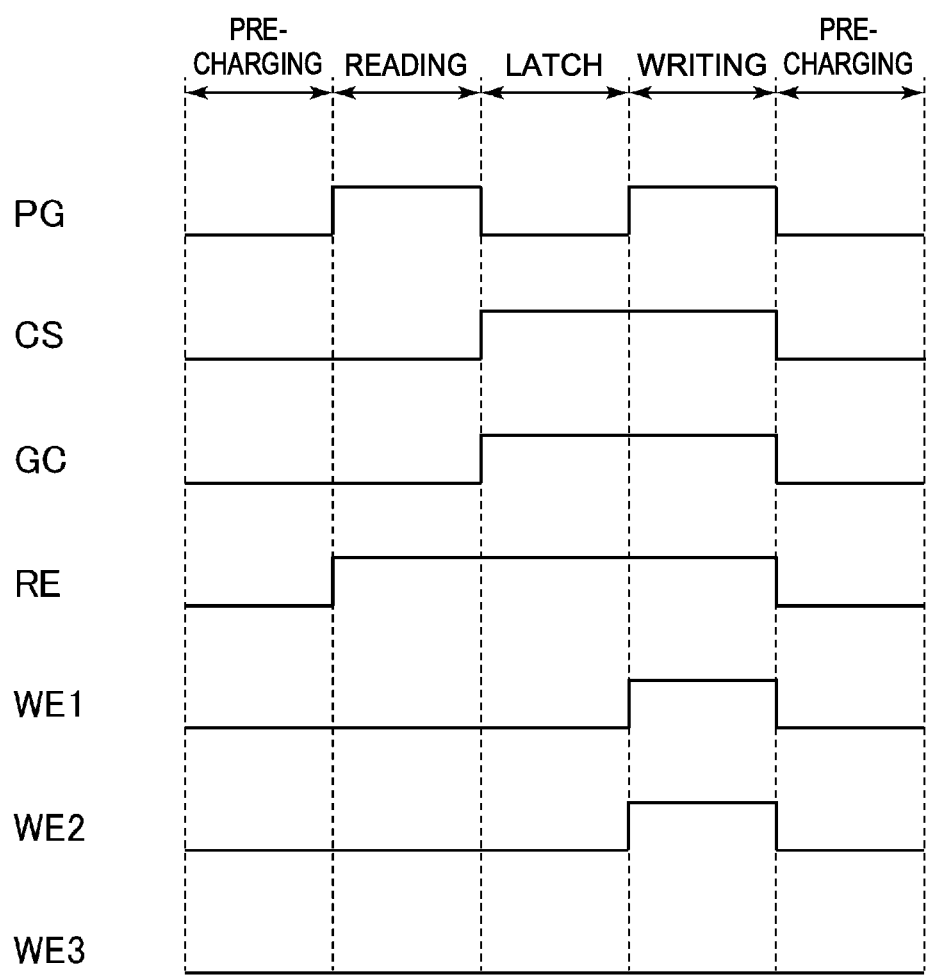
FIG. 6 is a timing chart showing a signal change of major signals of a copy mode.

In the copy mode, as shown in FIG. 6, a reading operation, a latch operation and a writing operation are sequentially performed. First, the reading operation in the 1-cell mode is performed in the same procedure as described above, to read the 1-bit data from the memory cell MCb1 that is an access object in the 1-cell mode. At that time, the reading object is the memory cell MCb1, so that the word line WLb1 corresponding to the memory cell MCb1 and the reference word line WRLa corresponding to the reference cell RCa are respectively made active. Thereby, the respective nodes Na, Nb of the sense amplifier 39 are made to have the electric potentials according to the resistance state of the MTJ element 22 of the memory cell MCb1.

After the reading operation, the control part 11 makes the transfer gate signal GC active, and the column selection signal CS non-active, so as to perform the latch operation. The transfer gate signal GC is made active, so that the respective transfer gates 37*a*, 37*b* of the transfer gate circuit 37 are turned on, and the node Na of the sense amplifier 39 is connected to the signal line ILb and the node Nb is connected to the signal line ILa. Accordingly, the 1-bit data read by the reading part 35 is inputted to the writing part 36. Also, the transfer gate signal GC is made active, so that the respective transfer gates 47*a*, 47*b* of the input gate circuit 47 are turned off.

The transfer gate signal GC is made active, so that the transistor 43 is turned on. When the transistor 43 is turned on, the reading part 35 is operated as a latch circuit, and the read 1-bit data is held in the reading part 35. The column selection signal CS is made non-active, so that the first bit line BLa, the second bit line BLb and the reading part 35 are isolated by the column selection circuit 34. However, as described above, the reading part 35 is operated as the latch circuit, so that the electric potentials of the nodes Na, Nb are maintained to a state immediately before separation. Also, in the copy mode, the reading signal RE is maintained active in the latch operation. The pre-charge signal PG is made active in the latch operation.

After the above-mentioned latch operation, the writing operation in the 2-cell mode is performed in the above-mentioned procedures, to write the 1-bit data to the cell unit CU2 that is an access object in the 2-cell mode. At this time, the cell unit CU2 that is an access object is constituted by the memory cells MCa2, MCb2, so that the corresponding word lines WLa2, WLb2 are respectively made active by the row selection circuit 15. Thereby, the respective cell transistors 21 of the memory cells MCa2, MCb2 are turned on. In the copy mode, the reading part 35 is operated as the latch circuit in the writing operation, so that the reading signal RE is continuously made active.

The first writing signal WE1 and the second writing signal WE2 are made active, so that the first drive circuit 51 and the second drive circuit 52 are actuated as is similar to a normal writing operation. The writing currents respectively flow to the memory cell MCa2 connected between the first bit line BLa and the first source line SLa and the memory cell MCb2 connected between the second bit line BLb and the second source line SLb, so as to change the magnetization of each MTJ element 22.

The electric potential of the signal line ILb (H- or L-level) connected to the node Na and the electric potential (H- or L-level) of the signal line ILb connected to the node Na are identical to that when the 1-bit data read by the reading part 35 is inputted as input data via the NAND circuits 61*a*, 61*b*. Accordingly, when the read data is "1", the MTJ element 22 of the memory cell MCa2 becomes in a low resistance state, the MTJ element 22 of the memory cell MCb2 becomes a high resistance state, and the 1-bit data of "1" is written to the cell unit CU2. When the read data is "0", the MTJ element 22 of the memory cell MCa2 becomes under a high resistance state, the MTJ element 22 of the memory cell MCb2 becomes under a low resistance state, and the 1-bit data of "0" is written to the cell unit CU2.

As described above, the 1-bit data read from the memory cell MCb1 in the 1-cell mode is copied to the cell unit CU4 connected to the bit line pair BP the same as the memory cell MCb1.

The case where the copy original is an access object in the 1-cell mode and the copy designation is an access object in the 2-cell mode has been explained above. However, as long as the access objects serving as the copy original and the copy designation are in the same column, access objects in any operation mode may do. Accordingly, the copy original may be the cell unit CU2 that is an access object in the 2-cell mode, or the cell unit CU4 that is an access object in the 4-cell mode. Also, the copy destination may be the memory cell MCa that is an access object in the 1-cell mode or the cell unit CU4 that is an access object in the 4-cell mode. In any case, the reading operation may be performed in the operation mode selected for the reading object, and after the latch operation, the writing operation may be performed in the operation mode selected to the writing object.

In this manner, in the memory device 10, the 1-bit data read by the reading part 35 is directly inputted from the reading part 35 to the writing part 36 connected to the same bit line pair BP as the reading part 35, so that the data can be efficiently copied.

In the above-mentioned memory device 10, when a cell configuration for holding one bit is one access unit for each of the operation mode, the access units in the different operation modes are mixed and connected to one bit line pair BP. In this example, the access unit includes the memory cells MCa, MCb in the 1-cell mode, and each cell unit in the 2-cell mode and the 4-cell mode. The access unit selected by making one set of the word lines WL with the number corresponding to the operation mode among the plural access units connected to one bit line pair BP is one for one set of the word line WL in the memory device 10. In other words, in the memory device 10, the access unit selected by one bit line pair BP and one set of the word lines WL never becomes plural. For example, in the 1-cell mode, only any one of one memory cell MCa and one memory cell MCb is selected for any one word line WL, one cell unit is selected for two word lines WL in the 2-cell mode, and one cell unit is selected for four word lines in the 4-cell mode.

Accordingly, in any operation mode, bit width of one bit line pair is one bit. This is because, the plural word lines WL are respectively connected to the memory cell MCa or the memory cell MCb connected to the bit line pairs BP different from each other, and the access unit in each operation mode is one memory cell MCa, one memory cell MCb connected to one bit line pair BP, or a cell unit including the same number of the memory cells MCa and the memory cell MCb.

In a conventional memory device, with a memory cell connected to one bit line of the bit line pair and a memory cell connected to the other bit line as one set, plural sets of the memory cells are connected to the bit line pairs, and the word lines are connected per set. That is to say, two memory cells in the set are connected to the same word line. Therefore, the number of the access units selected among the plural access units connected to one bit line pair BP by one set of the word lines according to the operation mode is different. For example, in the 2-cell mode, because one set of the memory cells is an access unit (cell unit), one set (one) of the word lines is made active, so as to select one access unit. Accordingly, bit width of one bit line pair in the 2-cell mode is one bit. In the 1-cell mode with each of the memory cells as an access unit, one set (one) of the word lines is made active, so as to select two memory cells in one set. Accordingly, the bit width of one bit line pair in the 1-cell mode is two bits. Therefore, in a conventional memory device, there is a need of a circuit or process coping with change of the reading operation or the writing operation per operation mode and the change of the bit width of one word line pair.

However, in the memory device 10, the bit width of one bit line pair BP is one bit, even if the operation mode is different. Therefore, the reading operation and the writing operation are basically the same, and there is no need of a circuit or process coping with the change of the bit width.

In the memory device 10, the bit width of one bit line pair BP is one bit in any operation mode, so that the 1-bit data can be copied and block-copied directly between the different operation modes. That is to say, the 1-bit data read by the reading part 35 can be directly inputted to the writing part 36 efficiently without special processing.

Figure 7:
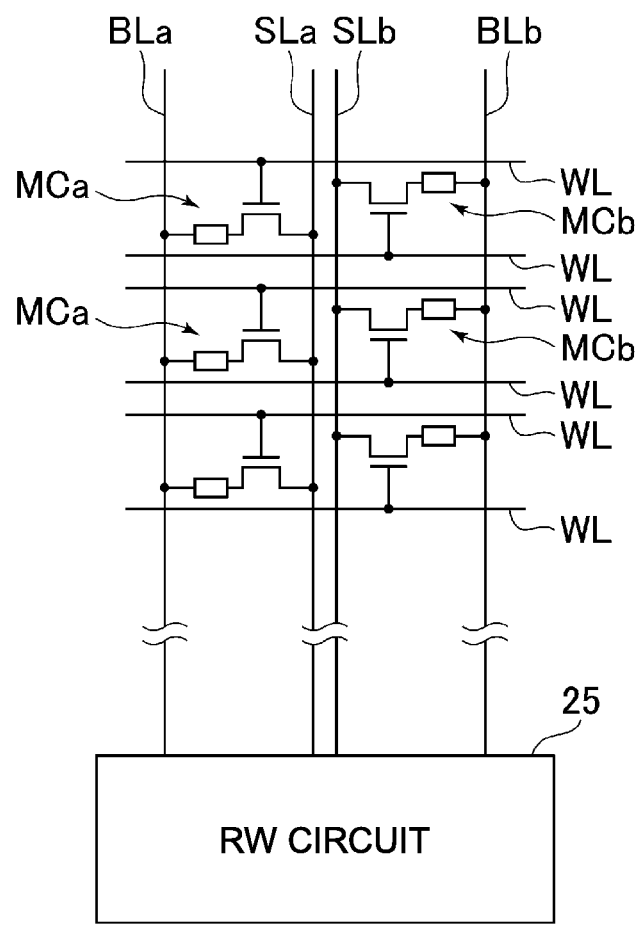
FIG. 7 is an explanatory diagram showing another arrangement example of a bit line and a memory cell.

The layout of the memory cells MCa, MCb is not limited to that as described above, but for example, a layout as shown in FIG. 7 may do. In the layout of the example of FIG. 7, the pair of the memory cell MCa connected to the first bit line BLa and the memory cell MCb connected to the second bit line BLb are separately aligned in a column direction. Even with such a layout, an effect similar to that as described above can be obtained.

In the above-mentioned example, an example using the MTJ element as a resistance change type memory element has been explained, but the resistance change type memory element is not limited to the MTJ element. Except for the MTJ element, the resistance change type memory element includes a resistance change element that is used for ReRAM (Resistive Random Access Memory) and changes an electric resistance due to electric field induction large resistance change, a phase change element that is used for PCRAM (Phase Change Random Access Memory) and rewrites the data by changing a phase state of a phase change material with Joule heat generated when the current flows, and the like. Also, other than the resistance change type memory element, a ferroelectric memory element constituted by a ferroelectric capacitor used for a ferroelectric memory (Ferroelectric Random Access Memory) may be used. When the resistance change type memory element and the ferroelectric memory element as described above are used, the reading part and the writing part of the read/write circuit are configured to have a circuit configuration corresponding to the used elements, and various well-known circuit configurations may be utilized.

Figure 8:
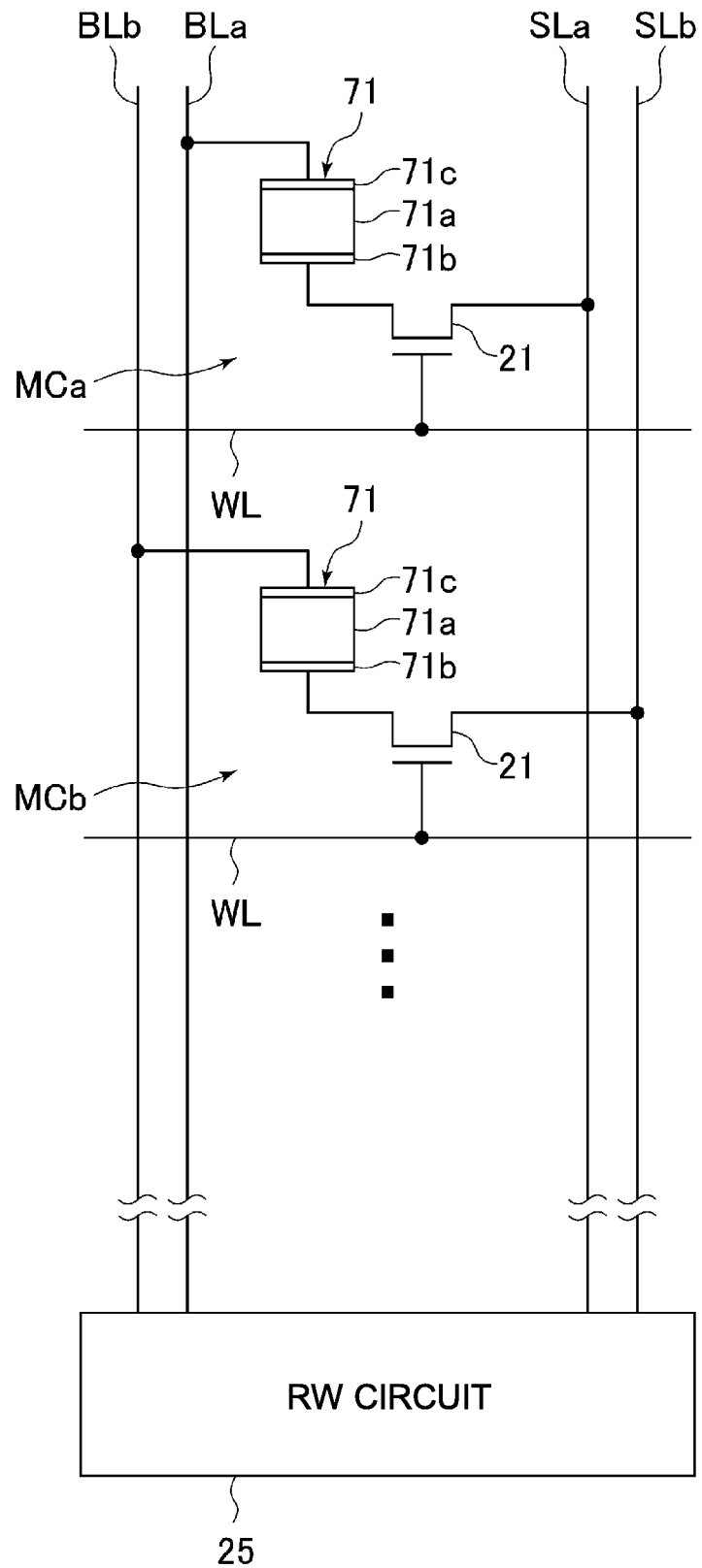
FIG. 8 is a circuit diagram showing an example using a resistance change element whose electric resistance changes according to electric field induction large resistance change.

FIG. 8 shows an example that a resistance change element 71 is used as a resistance change type memory element. The resistance change elements 71 of the memory cells MCa, MCb have such a structure that an oxide layer 71a such as tantalum oxide, titanium oxide and hafnium oxide is formed between metal layers 71b, 71c such as ruthenium, tantalum nitride and titanium nitride. The resistance change element 71 is changed to a high resistance state and a low resistance state according to polarity (direction of voltage) of a voltage pulse (writing voltage) applied between the metal layer 71b and the metal layer 71c, and the resistance of the oxide layer 71a is changed by the electric field induction large resistance change. In the resistance change element 71 of the memory cell MCa, the metal layer 71b is connected to the first source line SLa via the cell transistor 21, and the metal layer 71c is connected to the first bit line BLa. In the resistance change element 71 of the memory cell MCb, the metal layer 71b is connected to the second source line SLb via the cell transistor 21, and the metal layer 71c is connected to the second bit line BLb.

In the writing operation, for example, a voltage with polarity according to the 1-bit data to be written between the first bit line BLa and the first source line SLa is applied to the memory cell MCa by the read/write circuit 25. Then, the word line WL in the row of the memory cell MCa to be written is made active, and the cell transistor 21 of the memory cell MCa is turned on in a pulse manner. Thereby, a voltage pulse with polarity according to the 1-bit data to be written is applied to the resistance change element 71 of the memory cell MCa, so as to change a resistance state of the oxide layer 71a. The writing operation is performed to the memory cell MCb similarly. Accordingly, while the voltage is applied between the second bit line BLb and the second source line SLb, the word line WL is made active, so that the cell transistor 21 of the memory cell MCb is turned on in a pulse manner. Thereby, the resistance state of the oxide layer 71a of the resistance change element 71 of the memory cell MCb is changed.

In the reading operation, while a predetermined reading voltage is supplied to the first source line SLa and the second source line SLb from the read/write circuit 25, each word line WL connected to the memory cells MCa, MCb to be read is made active. Thereby, each cell transistor 21 of the memory cells MCa, MCb to be read is turned on, so that the reading current according to the resistance state (electric resistance) of the resistance change element 71 flows to the first bit line BLa and the second bit line BLb, respectively. In the read/write circuit 25, the difference between the respective reading currents is detected by a sense amplifier, so as to obtain the 1-bit data.

When the 1-cell mode is used, a reference cell including the resistance change element 71 is connected between the first bit line BLa and the first source line SLa, and between the second bit line BLb and the second source line SLb, respectively. In the reading operation in the 1-cell mode, as is similar to the above-mentioned example, the word line WL connected to one of the memory cell MCa and the memory cell MCb, and one reference word line are made active. The reference cell is similar also in the case of a phase change element, a ferroelectric memory element, a three-terminal type MTJ element and the like as described below.

Figure 9:
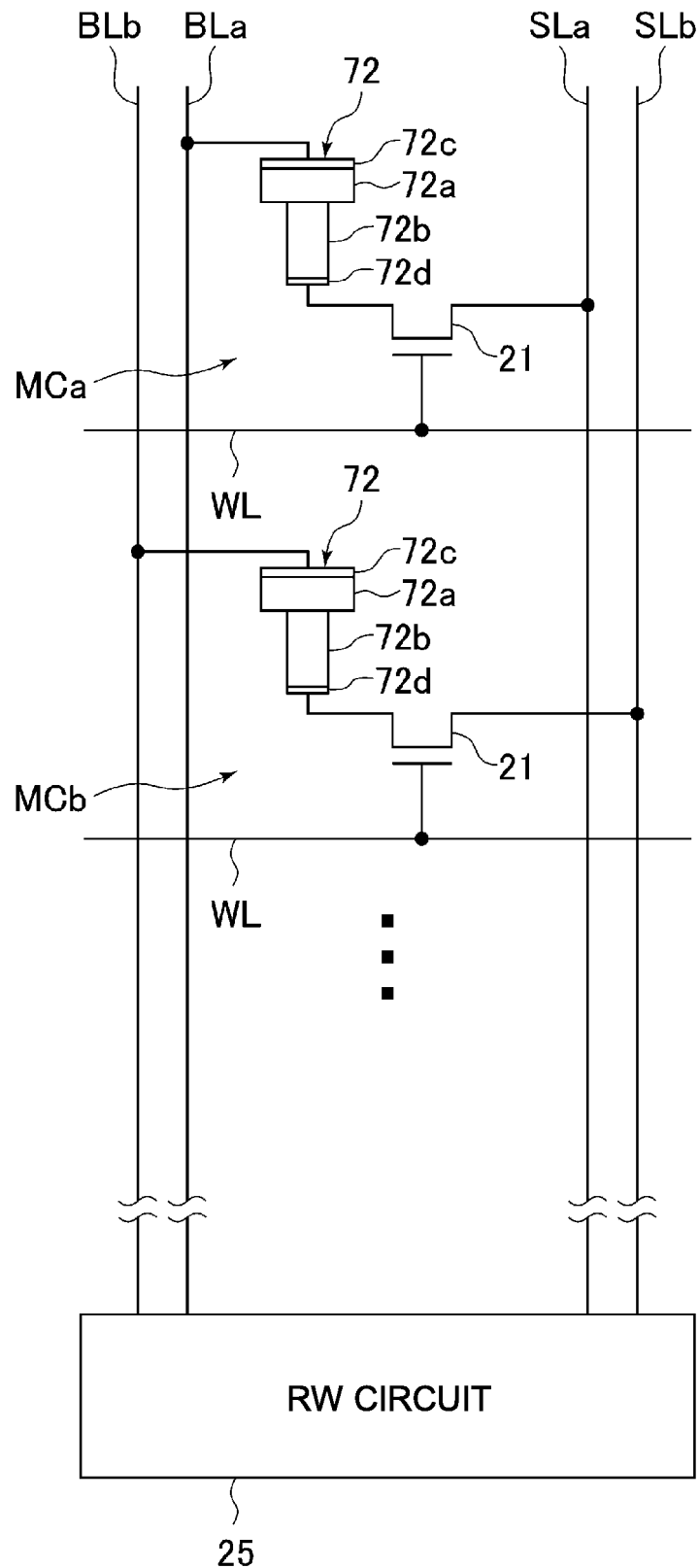
FIG. 9 is a circuit diagram showing an example using a phase change element.

FIG. 9 shows an example in which a phase change element 72 is used as a resistance change type memory element. The phase change element 72 has a phase change recording layer 72a, and a heater plug 72b provided in contact with a lower surface of the phase change recording layer 72a at one end. In the memory cell MCa, the phase change recording layer 72a is connected to the first bit line BLa via an upper electrode 72c provided on its upper surface, and the heater plug 72b is connected to the first source line SLa via a lower electrode 72d provided on its lower end surface and the cell transistor 21. Also, in the memory cell MCb, the phase change recording layer 72a is connected to the second bit line BLb via the upper electrode 72c, and the heater plug 72b is connected to the second source line SLb via the lower electrode 72d and the cell transistor 21.

The phase change recording layer 72a is formed of a phase change material (for example, chalcogenide) whose phase is changed between a crystal state (low resistance) and an amorphous state (high resistance). The phase change recording layer 72a causes the current to flow to the heater plug 72b in contact with it, and changes its phase by heating (Joule heat) generated on a contact interface of the heater plug 72b and the phase change recording layer 72a.

In the writing operation, the read/write circuit 25 causes a current to flow to change the phase of the phase change element 72 using the first bit line BLa and the first source line SLa to the memory cell MCa, and causes a current to flow to change the phase of the phase change element 72 using the second bit line BLb and the second source line SLb to the memory cell MCb. When the phase change recording layer 72a is changed from the crystal state to the amorphous state, such a pulse current is caused to flow that the phase change recording layer 72a is heated to not less than a melting point and rapidly cooled. When the phase change recording layer 72a is changed from the amorphous state to the crystal state, such a pulse-like writing current is caused to flow that crystalline temperature lower than the melting point is maintained for a constant time for crystallization. Accordingly, when the phase change element 72 is used, the magnitude (pulse height) of the writing current according to the 1-bit data to be written is controlled by the read/write circuit 25, and the pulse width of the current is controlled by an on-time of the cell transistor 21 with the word line WL.

In the reading operation, as is similar to the above-mentioned example, while a predetermined reading voltage is supplied to the first source line SLa and the second source line SLb, each word line WL connected to the memory cells MCa, MCb to be read is made active, so as to turn on each cell transistor 21. At this time, the difference between the reading currents respectively flowing to the first bit line BLa and the second bit line BLb via each phase change element 72 of the memory cells MCa, MCb is detected by the sense amplifier of the read/write circuit 25, so as to obtain the 1-bit data. The reading voltage is set to a value at which the phase of the phase change recording layer 72a is not changed.

Figure 10:
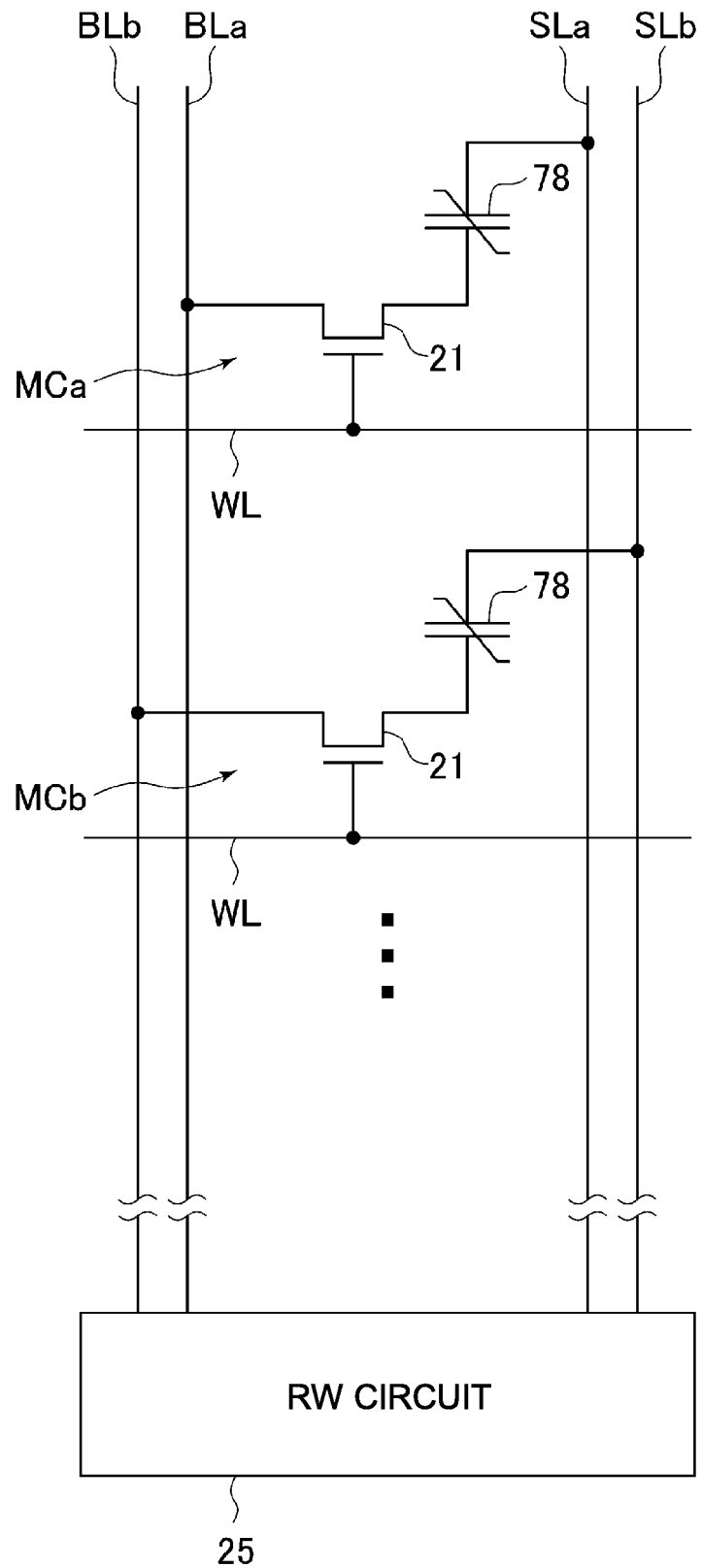
FIG. 10 is a circuit diagram showing an example using a ferroelectric memory element.

FIG. 10 shows an example that a ferroelectric memory element 78 is used. The ferroelectric memory element 78 configured as a ferroelectric capacitor is connected to the first bit line BLa via the cell transistor 21 at one end and connected to the first source line SLa at the other end in the case of the first memory cell MCa, and is connected to the second bit line BLb via the cell transistor 21 at one end and connected to the second source line SLb at the other end in the case of the second memory cell MCb. The reading part of the read/write circuit 25 is configured to detect a polarization direction of a ferroelectric body of the ferroelectric memory element 78, and the writing part is configured to change the polarization of the ferroelectric body to the direction based on the 1-bit data to be written.

In the writing operation, in the first memory cell MCa, the word line WL is made active to turn on the cell transistor 21, and a writing voltage is applied to the ferroelectric memory element 78 via the first bit line BLa and the first source line SLa by the read/write circuit 25. At this time, the applied writing voltage is directed to the direction according to the 1-bit data to be stored, so that the polarization direction of the ferroelectric body of the ferroelectric memory element 78 is directed to the direction corresponding to the 1-bit data to be written. Similarly, in the second memory cell MCb, the writing voltage is applied to the ferroelectric memory element 78 via the second bit line BLb and the second source line SLb by the read/write circuit 25. In the reading operation, the word line WL is made active to turn on the cell transistor 21, and the reading voltage in a predetermined direction is applied to the ferroelectric memory element 78 via the first bit line BLa and the first source line SLa in the case of the first memory cell MCa, and via the second bit line BLb and the second source line SLb in the case of the second memory cell MCb. At this time, the difference between the reading currents flowing to the first bit line BLa and the second bit line BLb is detected by the reading part of the read/write circuit 25, so as to specify the stored 1-bit data. When the direction of the reading voltage is the same as the polarization direction of the ferroelectric body, a slight reading current flows to the first bit line BLa or the second bit line BLb. When the directions are opposite to each other, a large reading current flows by reversing the polarization of the ferroelectric body.

Figure 11:
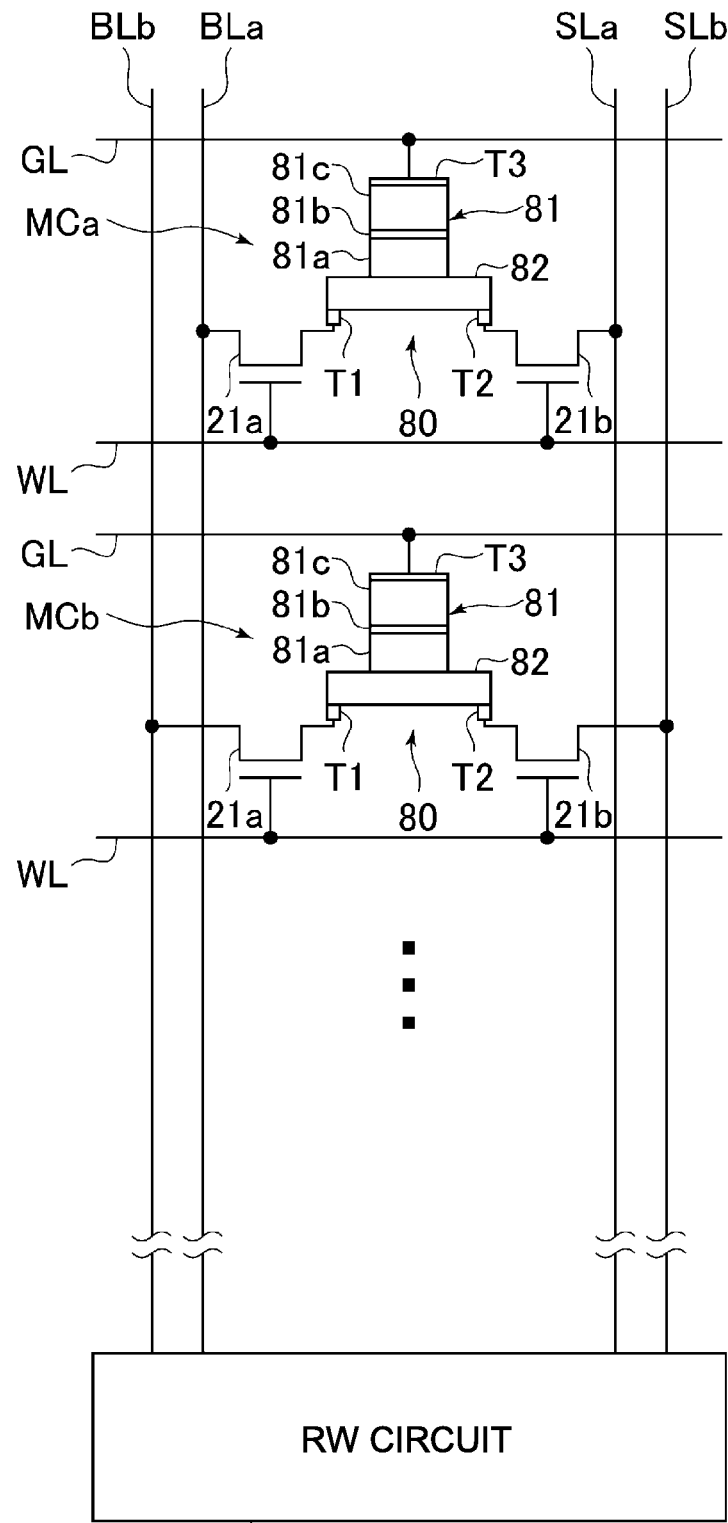
FIG. 11 is a circuit diagram showing an example using a three-terminal type MTJ element.

The above-mentioned memory element is of a two-terminal type, but a three-terminal type memory element may be used. An MTJ element 80 shown in FIG. 11 is of a three-terminal type of a writing method utilizing spin orbit torque (SOT: Spin Orbit Torque). The MTJ element 80 includes a laminate body 81, and a plate-like bias layer 82. The laminate body 81 is provided at a center part on one surface of the bias layer 82, and is structured so that a reference layer (magnetization fixed layer) 81a, a barrier layer (non-magnetic layer) 81b and a recording layer (magnetization free layer) 81c are sequentially laminated toward the bias layer 82. The reference layer 81a and the recording layer 81c are formed of a ferromagnetic body, and the barrier layer 81b is formed of an insulator. In the reference layer 81a, a magnetization direction is fixed to one direction of a direction (perpendicular direction in FIG. 11) perpendicular to its film surface. The recording layer 81c has an easy axis in the direction perpendicular to the film surface, and the magnetization direction thereof can be changed to any of a parallel state that the magnetization directions are the same as the reference layer 81a and an anti-parallel state that the directions are opposite to each other. The bias layer 82 is formed of, for example, an antiferromagnetic body, and the direction of each magnetic moment inside is one direction parallel to a direction (horizontal direction in FIG. 11) extending to the bias layer 82. Therefore, it can be understood that a steady magnetic field is applied to the recording layer 81c.

In the case of the memory cell MCa, in the MTJ element 80, a first terminal T1 provided at one end of the bias layer 82 is connected to the first bit line BLa via the cell transistor 21a, and a second terminal T2 provided at the other end is connected to the first source line SLa via the cell transistor 21b. Also, a third terminal T3 provided at an upper end of the reference layer 81a is connected to a ground line GL. The gates of the cell transistors 21a, 21b are respectively connected to the word lines WL. Similarly, in the case of the memory cell MCb, in the MTJ element 80, the first terminal T1 is connected to the second bit line BLb via the cell transistor 21a, the second terminal T2 is connected to the second source line SLb via the cell transistor 21b, and the third terminal T3 is connected to the ground line GL. Also, the gates of the cell transistors 21a, 21b of the memory cell MCb are respectively connected to the word lines WL corresponding to the memory cell MCb.

In the writing operation for writing the 1-bit data to the memory cell MCa, the word line WL connected to the memory cell MCa is made active, so as to turn on the cell transistors 21a, 21b, and a writing current is caused to flow in the direction corresponding to the 1-bit data to be written between the first terminal T1 and the second terminal T2 of the bias layer 82 using the first bit line BLa and the first source line SLa. Thereby, in a direction (perpendicular direction in FIG. 11) perpendicular to the film surface inside the bias layer 82, a spin flow is generated corresponding to the direction of the writing current, and a spin orbit torque is applied to the recording layer 81c. The spin orbit torque acts on the recording layer 81c to which a steady magnetic field is applied from the bias layer 82, so that the magnetization direction of the recording layer 81c is changed to any of the same direction (parallel state) as the reference layer 81a and the opposite direction (anti-parallel state) according to the direction of the spin flow. The writing current is caused to flow to the memory cell MCb in the direction corresponding to the 1-bit data to be written between the first terminal T1 and the second terminal T2 of the bias layer 82, using the second bit line BLb and the second source line SLb.

In the reading operation, the word line WL is made active to turn on the respective cell transistors 21a, 21b of the memory cells MCa, MCb, and a predetermined reading voltage is applied between the first bit line BLa connected to the first terminal T1 and the ground line GL connected to the third terminal T3. Thereby, a reading current flows to penetrate through the laminate body 81. At that time, the difference between the reading currents flowing to the first bit line BLa and the second bit line BLb is detected by the sense amplifier of the read/write circuit 25, so as to specify the stored 1-bit data. When the magnetization direction of the recording layer 81c is the same as the direction of the reference layer 81a, the resistance becomes relatively low, and when the direction is opposite to that of the reference layer 81a, the resistance becomes high. Also, the direction of the reading current may be any direction in a direction for penetrating the laminate body 81 in a lamination direction. Furthermore, a three-terminal type MTJ element of a magnetic domain wall displacement type may be used.

REFERENCE SIGNS LIST

- 10 memory device
- 11 control part
- 12 memory cell array
- 15 row selection circuit
- 19 mode selection part
- 21 cell transistor
- 22, 23, 80 MTJ element
- 35 reading part
- 36 writing part
- 71 resistance change element
- 72 phase change element
- 78 ferroelectric memory element
- BP bit line pair
- BLa first bit line
- BLb second bit line
- CU2, CU4 cell unit
- MCa, MCb, MCa1 to MCa4, MCb1 to MCb4 memory cell
- RCa, RCb reference cell
- WL, WLa1 to WLa4, WLb1 to WLb4 word line
- WRLa, WRLb reference word line

The invention claimed is:

1. A memory device having a memory cell array in which plural memory cells each including a serial circuit of an MTJ element and a cell transistor are arranged in a matrix manner, the plural memory cells including at least one or more first memory cells and one or more second memory cells, comprising:

plural bit line pairs each provided in a column direction and including a first bit line connected to the first memory cell and a second bit line connected to the second memory cell;

plural word lines provided in a row direction, and respectively connected to the first memory cell or the second memory cell connected to the bit line pairs different from each other;

a mode selection part having a plurality of operation modes and configured to select any of the plurality of operation modes, wherein the plurality of operation modes include at least any two of a first mode for reading and writing 1-bit data with the first memory cell or the second memory cell as a reading object and a writing object, a second mode for reading and writing the 1-bit data with a cell unit including the N first memory cells and the N second memory cells connected to the bit line pair as a reading object and a writing object where N is an integer equal to or more than 1, and a third mode for reading and writing the 1-bit data with a cell unit including the M first memory cells and the M second memory cells connected to the bit line pair as a reading object and a writing object where M is an integer equal to or more than 1 different from N;

a row selection circuit for activating the word lines connected to the first memory cell and the second memory cell as the reading object and the writing object based on each of the plurality of operation modes;

plural reading parts respectively provided corresponding to the plural bit line pairs, respectively including sense amplifiers connected between the pair of the first bit line and the second bit line, and reading the 1-bit data from the reading object; and plural writing parts respectively provided corresponding to the plural bit line pairs, respectively connected to the pair of the first bit line and the second bit line, causing a writing current to flow to one or both of the first bit line and the second bit line to write the 1-bit data to the writing object.

2. The memory device according to claim 1, wherein the reading part has a latch circuit for holing the 1-bit data read from the reading object, in a copy mode to copy the 1-bit data to any of other writing objects connected to the same bit line pair as the reading object from the reading object, and wherein the writing part has an input end connected to an output end of the latch circuit of the reading part connected to the same bit line pair as the reading part, and writes the 1-bit data inputted from the latch circuit via the input end to the writing object in the copy mode.

3. The memory device according to claim 2, comprising a control part for operating the plural reading parts and the plural writing parts provided corresponding to some or all of the plural bit line pairs in the copy mode.

4. The memory device according to claim 1, wherein the first memory cell and the second memory cell connected to the same bit line pair is arranged in the same column of the memory array.

5. The memory device according to claim 1, wherein the larger the number of the memory cells constituting the writing object gets, a writing current supplied to the first bit line and the second bit line is made larger.

6. The memory device according to claim 1, wherein the writing part writes complementary data to the first memory cell and the second memory cell constituting the cell unit.

7. The memory device according to claim 6, comprising:

a first reference cell and a second reference cell provided corresponding to the plural bit line pairs, the first reference cell being connected to the first bit line and the second reference cell being connected to the second bit line;

a first reference word line connected to the plural first reference cells; and a second reference word line connected to the plural second reference cells, wherein in the first mode, the row selection circuit makes the second reference word line active line together with the word line connected to the first memory cell when the 1-bit data is read from the first memory cell, and makes the first reference word line active together with the word line connected to the second memory cell when the 1-bit data is read from the second memory cell.

8. A memory device having a memory cell array in which plural memory cells each having a resistance change type memory element or a ferroelectric memory element and a cell transistor connected to each other are arranged in a matrix manner, the plural memory cells including at least one or more first memory cells and one or more second memory cells, comprising:
- plural bit line pairs each provided in a column direction and including a first bit line connected to the first memory cell and a second bit line connected to the second memory cell;
- plural word lines provided in a row direction, and respectively connected to the first memory cell or the second memory cell connected to the bit line pairs different from each other;
- a mode selection part having a plurality of operation modes and configured to select any of the plurality of operation modes, wherein the plurality of operation modes include at least any two of a first mode for reading and writing 1-bit data with the first memory cell or the second memory cell as a reading object and a writing object, a second mode for reading and writing the 1-bit data with a cell unit including the N first memory cells and the N second memory cells connected to the bit line pair as a reading object and a writing object where N is an integer equal to or more than 1, and a third mode for reading and writing the 1-bit data with a cell unit including the M first memory cells and the M second memory cells connected to the bit line pair as a reading object and a writing object where M is an integer equal to or more than 1 different from N;
- a row selection circuit for activating the word lines connected to the first memory cell and the second memory cell as the reading object and the writing object based on each of the plurality of operation modes;
- plural reading parts respectively provided corresponding to the plural bit line pairs, respectively connected to the pair of the first bit line and the second bit line, and reading the 1-bit data from the reading object; and
- plural writing parts respectively provided corresponding to the plural bit line pairs, respectively connected to the pair of the first bit line and the second bit line, causing a writing current to flow or applying writing voltage to one or both of the first bit line and the second bit line to write the 1-bit data to the writing object.

* * * * *